United States Patent
Kawamura

(10) Patent No.: US 6,288,940 B1
(45) Date of Patent: Sep. 11, 2001

(54) NON-VOLATILE SEMICONDUCTOR MEMORY DEVICE

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/599,462

(22) Filed: Jun. 22, 2000

(30) Foreign Application Priority Data

Jan. 6, 2000 (JP) .............................................. 2000-000941

(51) Int. Cl.⁷ ................................................ G11C 16/00
(52) U.S. Cl. ................................ 365/185.09; 365/185.29
(58) Field of Search .............................. 365/185.09, 200, 365/225.7, 185.29

(56) References Cited

U.S. PATENT DOCUMENTS

| | | | |
|---|---|---|---|
| 5,349,558 | * 9/1994 | Cleveland et al. | 365/185.09 |
| 5,353,253 | * 10/1994 | Nakajima | 365/200 |
| 5,475,693 | 12/1995 | Christopherson et al. | 371/10.2 |
| 5,590,075 | * 12/1996 | Mazzali | 365/185.09 |
| 5,621,690 | * 4/1997 | Jungroth et al. | 365/185.09 |
| 5,648,934 | * 7/1997 | O'Toole | 365/185.09 |
| 5,680,354 | * 10/1997 | Kawagoe | 365/225.7 |
| 5,771,346 | 6/1998 | Norman et al. | 365/185.22 |
| 5,796,653 | * 8/1998 | Gaultier | 365/185.09 |
| 5,815,433 | * 9/1998 | Takeuchi | 365/185.09 |

FOREIGN PATENT DOCUMENTS

| | | |
|---|---|---|
| 0 590 809 A2 | 4/1994 | (EP) . |
| 0 640 917 A3 | 3/1995 | (EP) . |
| 7-29392 | 1/1995 | (JP) . |

OTHER PUBLICATIONS

European Search Report dated Oct. 16, 2000.

* cited by examiner

*Primary Examiner*—Tan T. Nguyen
(74) *Attorney, Agent, or Firm*—Arent Fox Kintner Plotkin & Kahn, PLLC

(57) ABSTRACT

A non-volatile semiconductor memory device comprises a plurality of memory cell units each of which includes a plurality of non-volatile memory cells capable of having data electrically rewritten; a storage unit; and an access inhibiting circuit. The storage unit stores therein the defect information of the memory cell unit not normally operating. The access inhibiting circuit judges the condition of the memory cell unit within the device according to the defect information stored in the storage unit. Access to the memory cell unit not normally operating is inhibited in accordance with the result of the judgement. Since the device can control the information of the memory cell unit not normally operating by itself, users of the device need not manage the defective memory cell unit. Consequently, the usability of the device is enhanced and the cost of a system mounting the device is curtailed. Particularly, it is effective for the non-volatile semiconductor memory device for file allowing the presence of inoperative memory cells.

10 Claims, 28 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, and more particularly to a non-volatile semiconductor memory device allowing the presence of inoperative memory cells.

2. Description of the Related Art

In recent years, cellular phones have accomplished not only a vocal communication but also the transmittance of character or image data. The information content of cellular phone has increased and the capacity of a memory device built in the cellular phones tends to enlarge. In addition, a delivering service for music data has started on the Internet. The delivered music data are stored in a portable storage device, and are played back by, for example, inserting the storage device into a portable audio equipment.

As the portable equipment has spread described above, a large number of memory devices mounted or set on the portable equipment have been demanded. The memory device of this type needs to be low in power consumption (especially in a standby state), large in storage capacity and small in size. Further, the memory device of this type is often subjected to file management in which one block or sector is composed of a plurality of bits. In this case, some of the bits are allowed to be defective in the memory device as in a hard disk or a floppy disk.

A flash memory is non-volatile and capable of having electrically data written and erased data so it is the most suitable for the portable equipment. Therefore, the production of flash memories has yearly increased. In general, the memory cell array of the flash memory is constructed of a plurality of blocks (sometimes called sectors). The block is the minimum unit of erasing data stored in memory cells. Besides, the block is constituted of a plurality of pages.

FIG. 1 shows the flow of the full chip erase of data written in the flash memory.

First, at a step S201, a counter value indicating a block number is set at zero.

Subsequently, at a step S202, it is checked if the data of a block indicated by the counter value have been erased. In a case where the data have been erased, the procedure shifts to a step S204. In a case where the data have not been erased, the procedure shifts to a step S203.

At the step S203, all the blocks of the flash memory are selected and the data erase operation thereof is performed. Thereafter, the procedure shifts to the step S202 again.

At the step S204, it is checked if the block number indicated by the counter value is the maximum. In a case where the block number is the maximum, the batch erasing operation of the data is completed. In a case where the block number is not the maximum, the procedure shifts to a step S205.

At the step S205, the counter value is incremented by one, thereby increasing the block number indicated by the counter. Thereafter, the procedure shifts to the step S202.

Then, the procedure is repeated until the whole chip is fully erased.

Conventionally, the flash memory was shipped with the operations of all the implemented blocks guaranteed. However, in the case where the flash memory is used for file similar to hard disks or floppy disks as described above, all the blocks need not always be good. Therefore, the flash memory allowing a predetermined number of blocks to be bad (hereinafter referred to as "flash memory for file use") has been shipped. In general, the flash memory for file use has been developed in an NAND type or an AND type which has advantage for a high density.

Meanwhile, memory cells within the bad block cannot have the data of all their bits erased with reliability. With the flash memory for file use, therefore, the procedure always shifts to the step S203 after processing of the step S202 when performing the full chip erase of the data as shown in FIG. 1. In other words, the flash memory for file use has the problem that the full chip erase operation is never completed.

Furthermore, users who purchase the flash memory for file use need to manage the presence of the bad blocks in the flash memory by creating a table or the like.

FIG. 2 shows a flow for creating a bad block table. The flow is executed by a system mounting the flash memory, or the inspection apparatus of the users. The flash memory is shipped with all the bits of its good blocks erased.

First, at a step S101, the value of a counter indicating a block number is set at zero.

Subsequently, at a step S102, it is checked if the data of those "0" and "1" of pages within a block indicated by the counter value have been erased. In a case where all the data of the pages "0" and "1" have been erased, the block is judged to be good, and the procedure shifts to a step S104. In a case where the data of the pages "0" and "1" have not been erased, the block is judged to be bad, and the procedure shifts to a step S103. Incidentally, at the step S102, the data erasure may well be checked for all the pages within the block.

At the step S103, the counter value is stored as a bad block number in the bad block table, and the procedure shifts to the step S104.

At the step S104, it is checked if the block number indicated by the counter value is the maximum. In a case where the block number is the maximum, the creation of the bad block table is completed. In a case where the block number is not the maximum, the procedure shifts to a step S105.

At the step S105, the counter value is incremented by one, thereby to increase the block number indicated by the counter. Thereafter, the procedure shifts to the step S102.

Then, the above procedure is repeated until the bad block table is created. The bad block table must be made for every purchased flash memory, causing large workload thereof.

Furthermore, the system mounting the flash memory needs to be controlled according to the bad block table in order to access any bad block.

SUMMARY OF THE INVENTION

An object of the present invention is to provide a non-volatile semiconductor memory device capable of controlling bad blocks by itself.

Another object of the present invention is to easily perform a data erase operation in a non-volatile semiconductor memory device allowing the presence of bad blocks.

According to one of the aspects of a non-volatile semiconductor memory device in the present invention, the device comprises a plurality of memory cell units, each including a plurality of non-volatile memory cells capable of having electrically data rewritten; a storage unit; and an access inhibiting circuit. The storage unit stores defect information of the memory cell unit not normally operating. The access inhibiting circuit judges the condition of the memory cell unit within the device according to the defect information stored in the storage unit. Access to the memory cell unit not normally operating is inhibited in accordance with the resultant. Users of the device need not manage the defective memory cell unit since the device itself can control the information of the memory cell unit not normally operating. This improves the usability of the device and reduces the cost of a system mounting the device.

According to another aspect of the non-volatile semiconductor memory device in the present invention, the storage unit is formed of non-volatile elements. Therefore, the defect information of the memory cell unit not normally operating is held in the device independent of the switch-on/off of the power supply. For example, after the probing test of the device on a wafer or the classification test of the package thereof, the defect information can be stored in the storage unit by utilizing the test results. In other words, the defect information is stored in the storage unit before the shipment of the device. This makes it unnecessary for users of the device to create a bad block table or the like, resulting in greatly improving the usability.

According to another aspect of the non-volatile semiconductor memory device in the present invention, the storage unit is constructed of non-volatile memory cells respectively formed in the memory cell units. The defect information on whether or not the memory cell unit normally operates is stored in each memory cell unit. It is possible to perform a write operation and an erase operation on the storage unit therein same as in the memory cells used in normal operations. This enables the simple formation of the circuits for controlling the storage unit.

According to another aspect of the non-volatile semiconductor memory device in the present invention, the storage unit is formed in accordance with an allowable number of the memory cell units not normally operating. Therefore, it is no longer necessary to form the storage unit in each memory cell unit, resulting in reducing the chip size.

According to another aspect of the non-volatile semiconductor memory device in the present invention, the device comprises an output controlling circuit. The output controlling circuit outputs the defect information to the exterior when an inoperative memory cell unit has been accessed. The system mounting the device can readily obtain the defect information without any special control table or the like. In other words, it can be readily detected that the operation of the memory cell unit has been inhibited due to the occurrence of an improper access.

According to another aspect of the non-volatile semiconductor memory device in the present invention, the defect information is outputted in response to a request from the exterior when an inoperative memory cell unit has been accessed. Therefore, the system mounting the device can readily obtain the defect information without any special control table or the like. Moreover, the system can obtain the defect information at its own control timings.

According to another aspect of the non-volatile semiconductor memory device in the present invention, a request to the defect information from the exterior is made by a command input. Therefore, the system mounting the device can obtain the defect information by a control similar to that of other commands without altering hardware.

According to another aspect of the non-volatile semiconductor memory device in the present invention, the device comprises a plurality of memory cell units, each including a plurality of non-volatile memory cells capable of having electrically data rewritten, and a storage unit. The storage unit stores the information of the memory cell unit not normally operating. In addition, when an erase operation has occurred on the memory cell unit not normally operating, circuits in the device forcibly terminate the erase operation on the memory cell unit. Unlike in the prior art, it can be prevented that the erase operation never completes on the memory cell unit not normally operating never completes. Particularly, it can be prevented that the operation aborts in the process of fully erasing a plurality of memory cell units.

According to another aspect of the non-volatile semiconductor memory device in the present invention, the storage unit is constructed of the non-volatile memory cells respectively formed in the memory cell units. The defect information on whether or not the memory cell unit normally operates is stored in each memory cell unit. A write operation and an erase operation on the storage unit can be performed same as those to the memory cells used in normal operations. This enables the simple formation of the circuits for controlling the storage unit.

According to another aspect of the non-volatile semiconductor memory device in the present invention, the storage unit is formed in accordance with an allowable number of the memory cell units not normally operating. Therefore, it is no longer necessary to form the storage unit in each memory cell unit, resulting in reducing a chip size.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Now, the embodiments of the present invention will be described with reference to the drawings.

Figure 3:
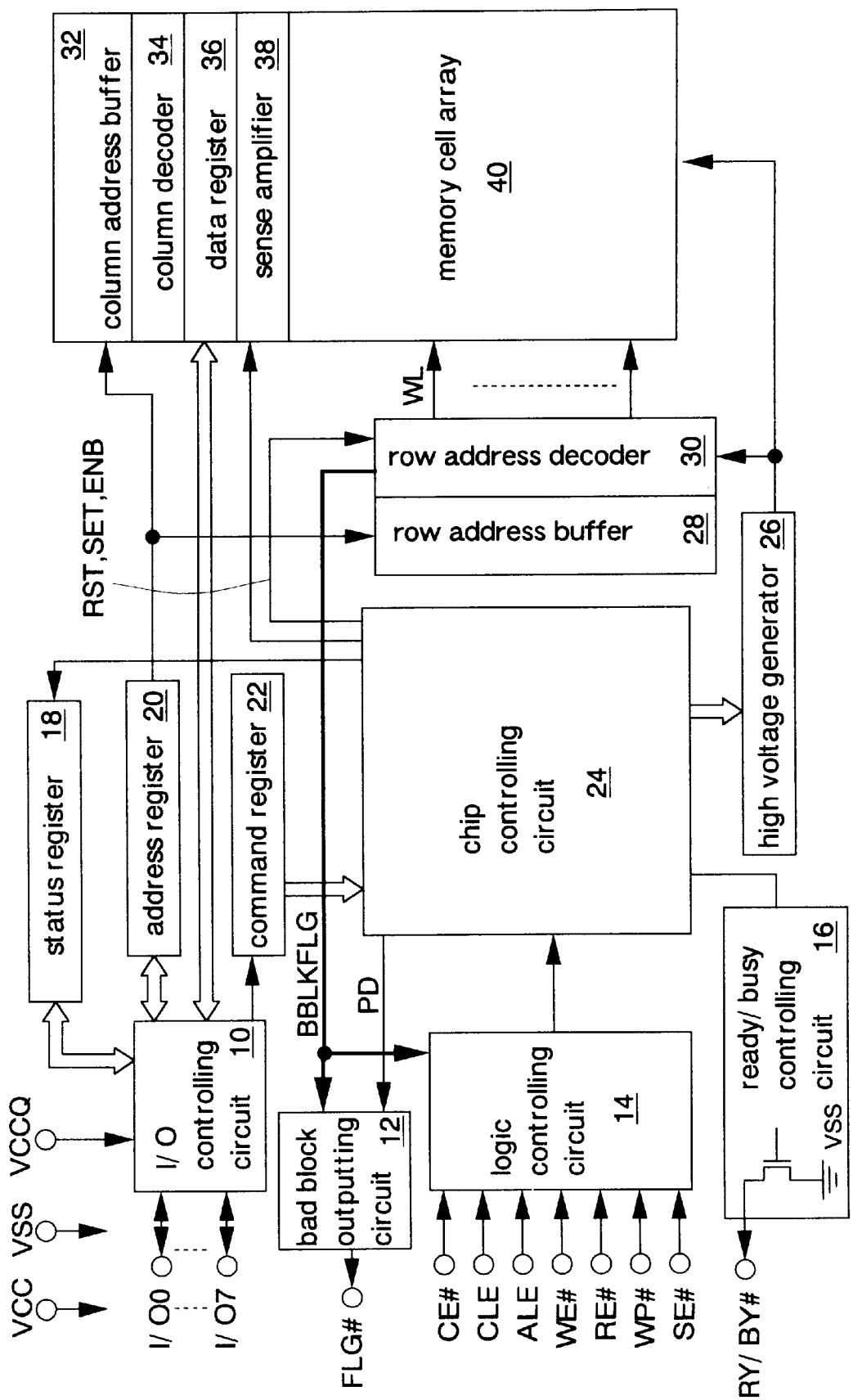
FIG. 3 is a block diagram showing the first embodiment.

FIG. 3 shows the first embodiment of a non-volatile semiconductor memory device in the present invention. In the following description, the same symbols as the names of terminals shall be used for signals fed through the terminals, for example, an "address terminal ADD" for an "address signal ADD". Besides, the names of signals and those of terminals shall be sometimes expressed as abridged names, for example, the "address signal ADD" as the "ADD signal", and a "command-latch enable terminal CLE" as a "CLE terminal". Signals and terminals adding marks "#" and "B" at their tails, are of negative logic.

The non-volatile semiconductor integrated circuit of this embodiment is formed as an NAND type flash memory of 64 M-bit on a silicon substrate by the use of CMOS process technology. This flash memory is chiefly used for file same as a hard disk, a floppy disk, and the like.

The flash memory comprises an I/O controlling circuit 10, a bad block outputting circuit 12, a logic controlling circuit 14, a ready/busy controlling circuit 16, a status register 18, an address register 20, a command register 22, a chip controlling circuit 24, a high voltage generator 26, a row address buffer 28, a row address decoder 66, a column address buffer 32, a column decoder 34, a data register 68, a sense amplifier 38, and a memory cell array 70.

The I/O controlling circuit 10 accepts information necessary for the operation of the chip of the flash memory from the exterior, and outputs the status of the chip to the exterior. By way of example, the I/O controlling circuit 10 accepts a command signal, a data signal and address signals received through I/O terminals I/O0–I/O7, and it outputs the accepted signals to internal circuits.

The bad block outputting circuit 12 receives a bad block flag signal BBLKFLG and a standby signal PD, and it outputs the information of a bad block to the exterior through a flag terminal FLG#.

The logic controlling circuit 14 receives signals supplied from the exterior through a chip enable terminal CE#, a command-latch enable terminal CLE, an address-latch enable terminal ALE, a write enable terminal WE#, a read enable terminal RE#, a write protect terminal WP# and a spare-area enable terminal SE#, and it outputs a plurality of control signals to the chip controlling circuit 24.

The ready/busy controlling circuit 16 includes an nMOS transistor whose source is grounded, and whose drain is connected to a ready/busy terminal RY/BY#. The gate of the nMOS transistor is controlled by the chip controlling circuit 24. The ready/busy controlling circuit 16 has the function of transmitting the ready or busy status of the chip, to the exterior.

The status register 18 receives information from the chip controlling circuit 24, and outputs the received information to the I/O controlling circuit 10.

The address register 20 receives the address signals from the I/O controlling circuit 10, and outputs the received signals to the row address buffer 28 as well as the column address buffer 32.

The command register 22 receives the command signal from the I/O controlling circuit 10, and outputs the received signal to the chip controlling circuit 24.

The chip controlling circuit 24 controls the entire chip in accordance with the signals supplied from the exterior, and it also controls the transmission of the state of the chip to the exterior. The chip controlling circuit 24 outputs the standby signal PD to the bad block outputting circuit 12, and it outputs a reset signal RST, a set signal SET and an enable signal ENB to the row address decoder 30.

The high voltage generator 26 receives the control signal from the chip controlling circuit 24 and generates a high voltage, and it feeds the voltage to the row address decoder 30 and the memory cell array 40.

The row address buffer 28 transmits the address signal from the address register 20 to the row address decoder 30. The row address decoder 30 has the function of decoding the row address signal from the row address buffer 28 and then activating a predetermined one of word lines WL. In addition, the row address decoder 30 outputs the bad block flag signal BBLKFLG.

The column address buffer 32 transmits the address signal from the address register 20 to the column decoder 34. The column decoder 34 decodes the column address signal, and outputs the decoded signal to the data register 36.

The data register 36 transmits write data to the memory cell array 40, and it also transmits read data from memory cells to the I/O controlling circuit 10. The sense amplifier 38 amplifies the read data which are to be transmitted to the data register 36. The memory cell array 40 includes a plurality of memory cell units (not shown) each of which has a plurality of non-volatile memory cells capable of having electrically data rewritten. In this embodiment, the memory cell units shall be called the "blocks". The data of the memory cells are erased in block units.

Incidentally, the flash memory is fed with a supply voltage VCC, a supply voltage VCCQ dedicated to the I/O terminals, and a ground voltage VSS from the exterior. The supply voltage VCCQ is fed to the I/O controlling circuit 10.

Figure 4:
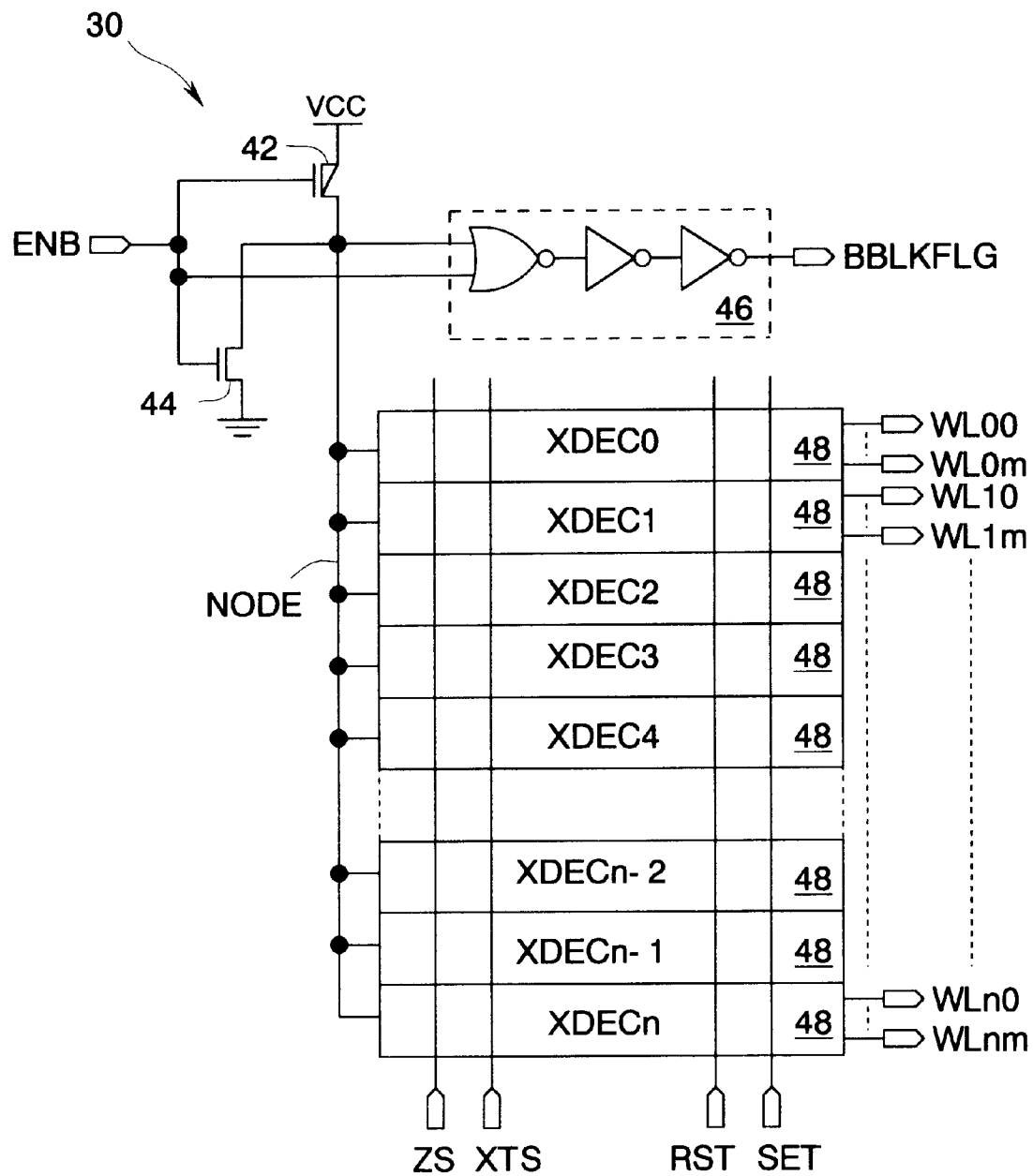
FIG. 4 is a circuit diagram showing the details of a row address decoder shown in FIG. 3.

FIG. 4 shows the details of the row address decoder 30.

The row address decoder 30 includes a pMOS transistor 42, an nMOS transistor 44, an NOR circuit 46, and a plurality of decoding circuits 48. Hereinbelow, the "pMOS transistor" and "nMOS transistor" shall be respectively termed the "pMOS" and "nMOS".

The pMOS 42 has its source connected to the power supply line VCC and has its drain connected to a node NODE, and it receives an enable signal ENB at its gate. On the other hand, the nMOS 44 has its source connected to the ground line VSS and has its drain connected to the node NODE, and it receives the ENB signal at its gate. The ENB signal is generated from, for example, the CE# signal, and it is turned to low level when the chip is activated.

The NOR gate 46 receives the voltage of the node NODE and the ENB signal, and it outputs the BBLKFLG signal. The node NODE is connected to the respective decoding circuits 48.

The decoding circuits 48 are circuits for selecting the blocks which are the erasing units. Each of the decoding circuits 48 is fed with a plurality of address signals Zs (upper address bits) and XTs (lower address bits) from the row address buffer 28, and the reset signal RST and the set signal SET from the chip controlling circuit 24. Each decoding circuit 48 has the function of activating the predetermined word line WL in accordance with the address signals Zs and XTz.

Figure 5:
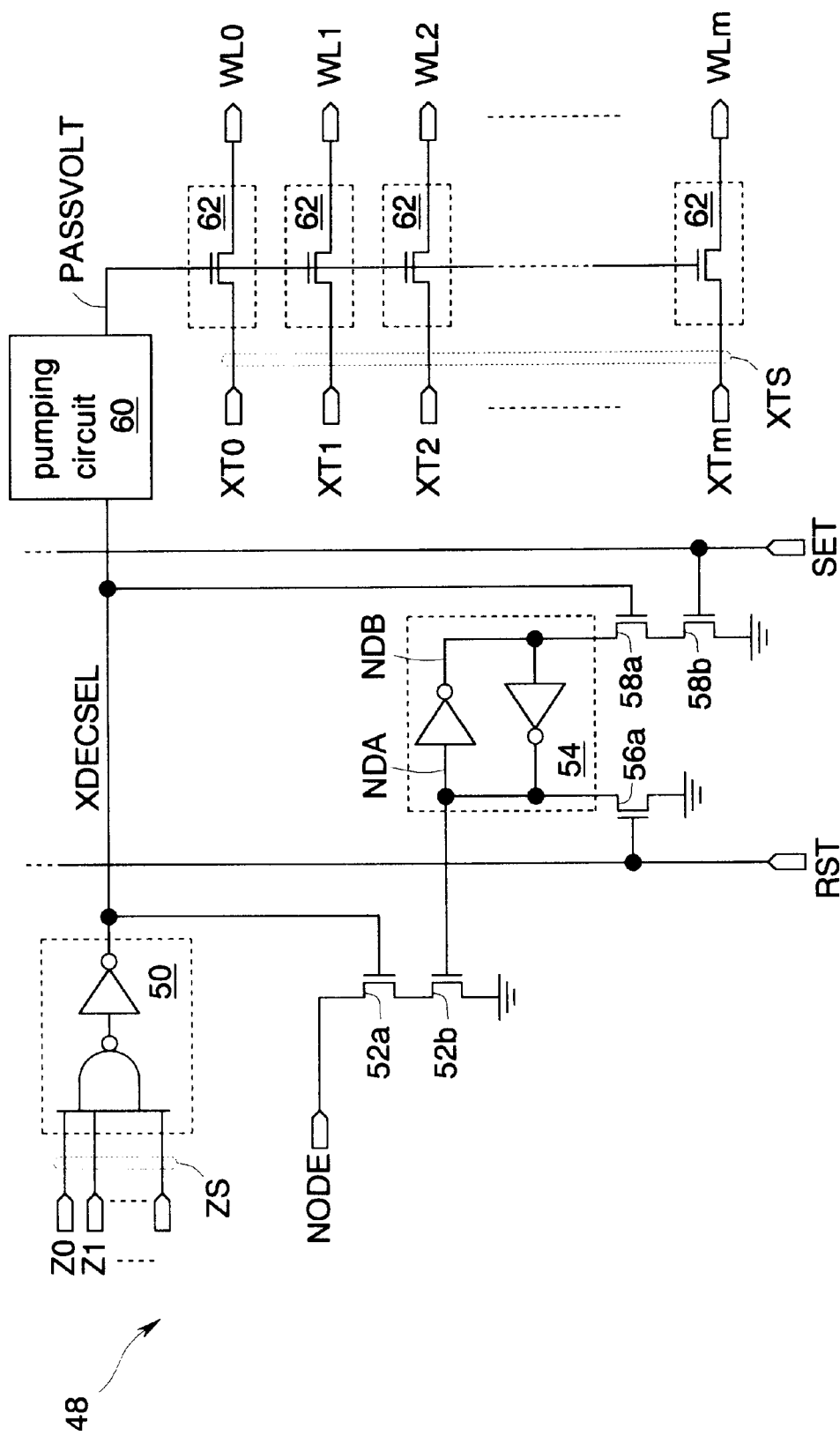
FIG. 5 is a circuit diagram showing the details of a decoding circuit shown in FIG. 4.

FIG. 5 shows the details of the decoding circuit 48.

The decoding circuit 48 includes an AND circuit 50, nMOS's (nMOS transistors) 52a, 52b connected in series, a latching circuit 54, an nMOS 56, nMOSIs 58a, 58b connected in series, a pumping circuit 60, and a plurality of word line drivers 62 each being constructed of an nMOS.

The AND circuit 50 receives the plurality of address signals Zs, and outputs the decoded signal thereof to the gate of the nMOS 52a as a selecting signal XDECSEL. Here, the logic of the address signals Zs which are fed to the AND circuit 50 is determined every decoding circuit 48.

The nMOS 52a has its drain connected to the node NODE, and receives the XDECSEL signal at its gate. The nMOS 52b has its source connected to the ground line VSS, and has its gate connected to a node NDA.

The nMOS 56a has its source connected to the ground line VSS and has its drain connected to the node NDA, and it receives the RST signal at its gate. The nMOS 58a has its drain connected to a node NDB, and receives the XDECSEL signal at its gate. The nMOS 58b has its source connected to the ground line VSS, and receives the SET signal at its gate.

The latching circuit 54 is constructed by connecting the inputs and outputs of two inverters to each other. Herein, complementary bad block information is held at the nodes NDA and NDB. That is, the flash memory of this embodiment comprises a storage unit which electrically holds the defect information of the block (hereinafter referred to as "bad block information") for itself, unlike the prior art flash memory.

The pumping circuit 60 feeds a signal of high voltage PASSVOLT to the gates of the nMOS's of the word line drivers 62 during the activation of the XDECSEL signal.

The word line drivers 62 are circuits which select the word lines WL in accordance with the address signals XTs during the activation of the XDECSEL signal.

Figure 6:
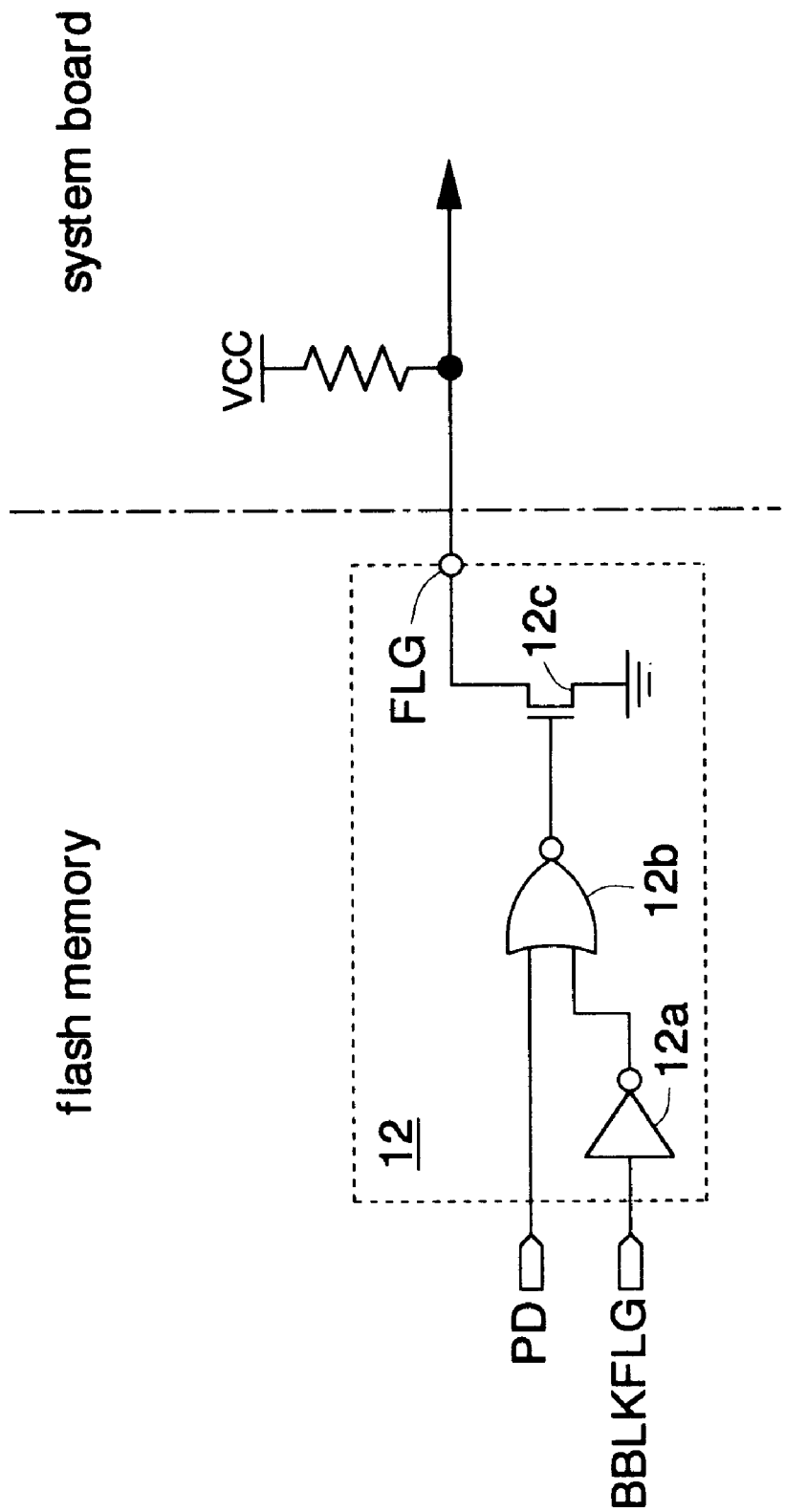
FIG. 6 is a circuit diagram showing the details of a bad block outputting circuit shown in FIG. 3.

FIG. 6 shows the details of the bad block outputting circuit 12.

The bad block outputting circuit 12 is configured of an inverter 12a, an NOR gate 12b and an nMOS transistor 12c.

The NOR gate 12b receives the PD signal, and also receives the inverted signal of the BBLKFLG signal through the inverter 12a. The gate of the nMOS transistor 12c is controlled by the output of the NOR gate 12b. The bad block outputting circuit 12 turns on the nMOS transistor 12c and outputs the low level to an FLG terminal when the PD signal is at low level and the BBLKFLG signal is at high level. That is, the bad block outputting circuit 12 operates as an output controlling circuit which outputs the bad block information to the exterior. Since the bad block outputting circuit 12 is of the open drain type, the FLG terminal is, for example, pulled up on a substrate board of a system mounting the flash memory.

Next, the operation of the flash memory of this embodiment will be described.

Figure 7:
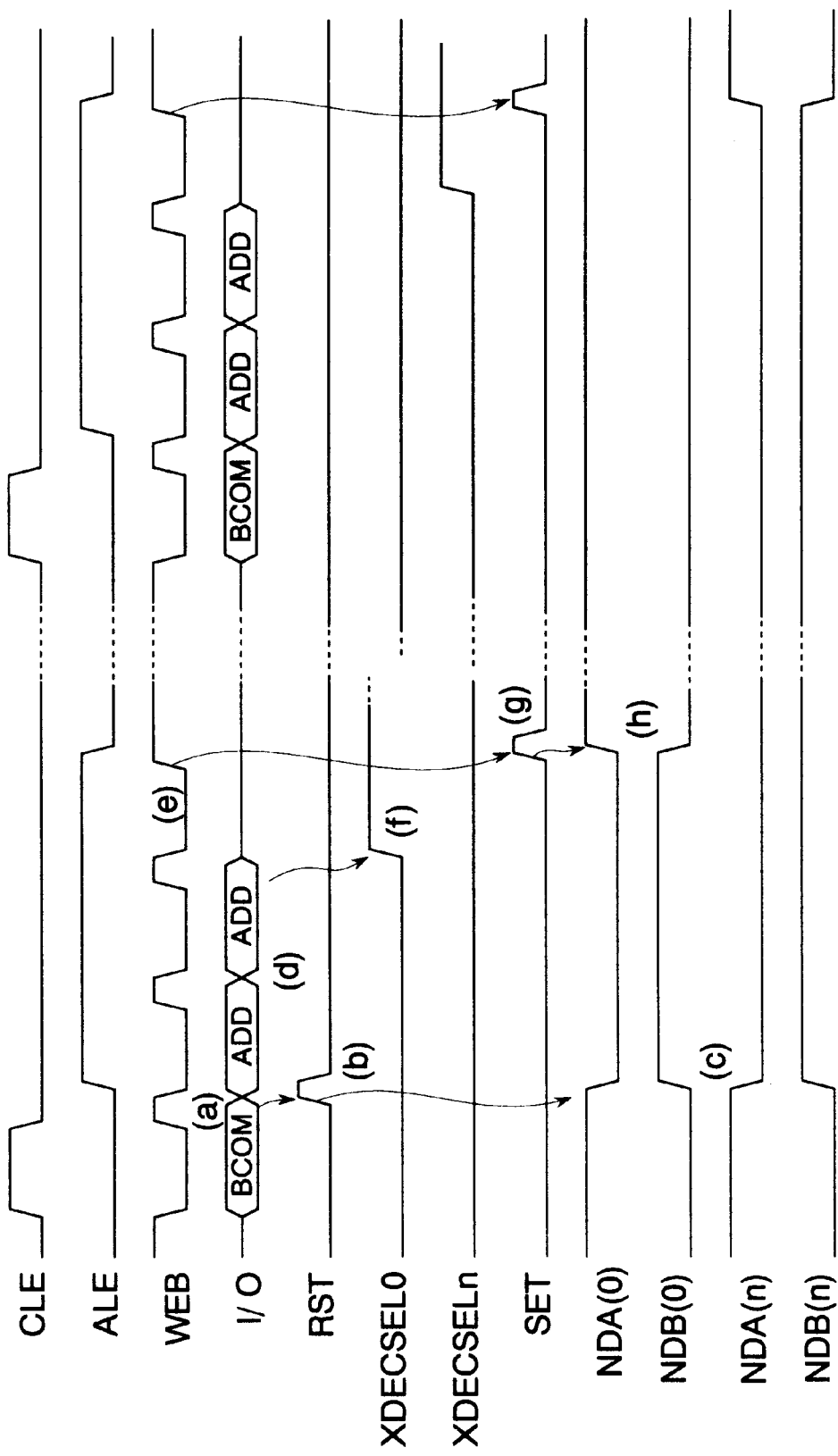
FIG. 7 is a timing chart showing the operation of writing bad block information into a latching circuit in the first embodiment.

FIG. 7 shows timings at which the bad block information is written into the latching circuit 54 according to a bad block table created beforehand. In this example, there will be explained a case where blocks "0" and "n" are the bad blocks which do not operate normally.

First, a command is inputted at the same timing as in the prior art. More specifically, the CLE signal is activated (the high level), and a bad block write command BCOM is fed through the I/O terminals (FIG. 7(a)). The BCOM command is accepted in synchronization with the rising edge of a WEB signal. The chip controlling circuit 24 shown in FIG. 3 outputs the RST signal of high-level pulse in synchronization with the acceptance of the BCOM command (FIG. 7(b)). By way of example, the RST signal is activated only for the feed of the first BCOM command after the power has been switched on.

The nMOS 56a of the decoding circuit 48 as shown in FIG. 5 is turned on upon receiving the RST signal, thereby to change the node NDA to the low level and to change the node NDB to the high level (FIG. 7(c)). That is, the latching circuits 54 of all the decoding circuits 48 are reset by the RST signal. Incidentally, the low level of the node NDA indicates that the block controlled by the correspondent decoding circuit 48 is a good block.

Subsequently, the ALE signal is activated (the high level), and the address information (ADD) of the block "0" being the bad block is fed at twice through the I/O terminals (FIG. 7(d)). The divided address information is respectively accepted in synchronization with the rising edges of the pulses of the WEB signal. After the feed of the address information, a dummy WEB signal is further activated (FIG. 7(e)).

The decoding circuit 48 (FIG. 5) corresponding to the block "0" receives the address signals Zs and activates (the high level) the XDECSEL signal by the AND circuit 50 (FIG. 7(f)). The nMOS 58a is turned on upon receiving the XDECSEL signal. Besides, the chip controlling circuit 24 activates (the high level) the SET signal in synchronization with the activation of the dummy WEB signal (FIG. 7(g)). The nMOS 58b is turned on upon receiving the SET signal. As a result, the node NDB is turned to the low level, and the node NDA is turned to the high level (FIG. 7(h)). That is, the bad block information is written into the decoding circuit 48 corresponding to the block "0".

Likewise, the bad block write command BCOM and the address information of the block "n" are fed, and the bad block information is written into the decoding circuit 48 corresponding to the block "n".

Figure 8:
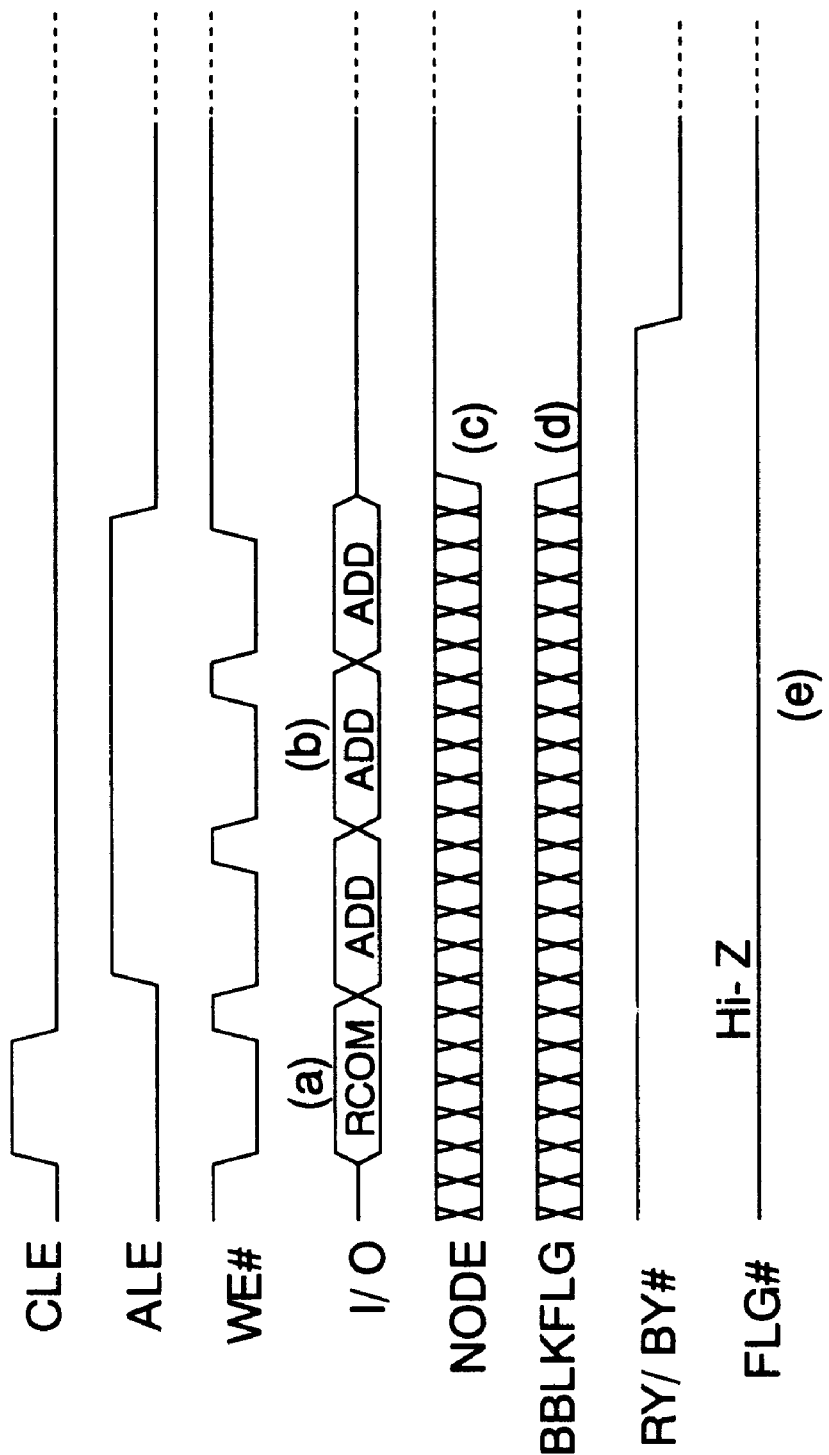
FIG. 8 is a timing chart showing a read operation on a good block in the first embodiment.

FIG. 8 shows the timings of a read operation on a good block in the flash memory in which the bad block information has been written.

First, a command is inputted at the same timing as in the prior art. More specifically, the CLE signal is activated, and a read command RCOM is fed through the I/O terminals (FIG. 8(a)).

Subsequently, the ALE signal is activated, and read address information (ADD) is fed at three times through the I/O terminals (FIG. 8(b)). The decoding circuit 48 of the block corresponding to the read address information receives the address signals Zs and activates the XDECSEL signal. The nMOS 52a is turned on upon receiving the XDECSEL signal. Here, in a case where the node NDA is at the low level (indicating the good block), the nMOS 52b is inactivated. Therefore, the level of the node NODE is determined by the PMOS 42 and nMOS 44 shown in FIG. 4. Since the ENB signal has been turned to the low level during the activation of the chip, the pMOS 42 is turned on, and the nMOS 44 is turned off. The node NODE is turned to the high level by the turn-on of the pMOS 42 (FIG. 8(c)).

The NOR circuit 46 outputs the low level of the BBLKFLG signal upon receiving the high level of the node NODE (FIG. 8(d)).

The bad block outputting circuit 12 shown in FIG. 6 has its nMOS 12c turned off upon receiving the low levels of the PD signal and the BBLKFLG signal. Accordingly, the FLG# terminal holds a high-impedance state Hi-Z (FIG. 8(e)). Incidentally, the nMOS 12c is also turned off by turning the PD signal to the high level in a power-down mode.

Thereafter, when the read operation has been started within the chip, the RY/BY# signal reaches the low level indicating to the exterior that the chip is in the busy status.

Figure 9:
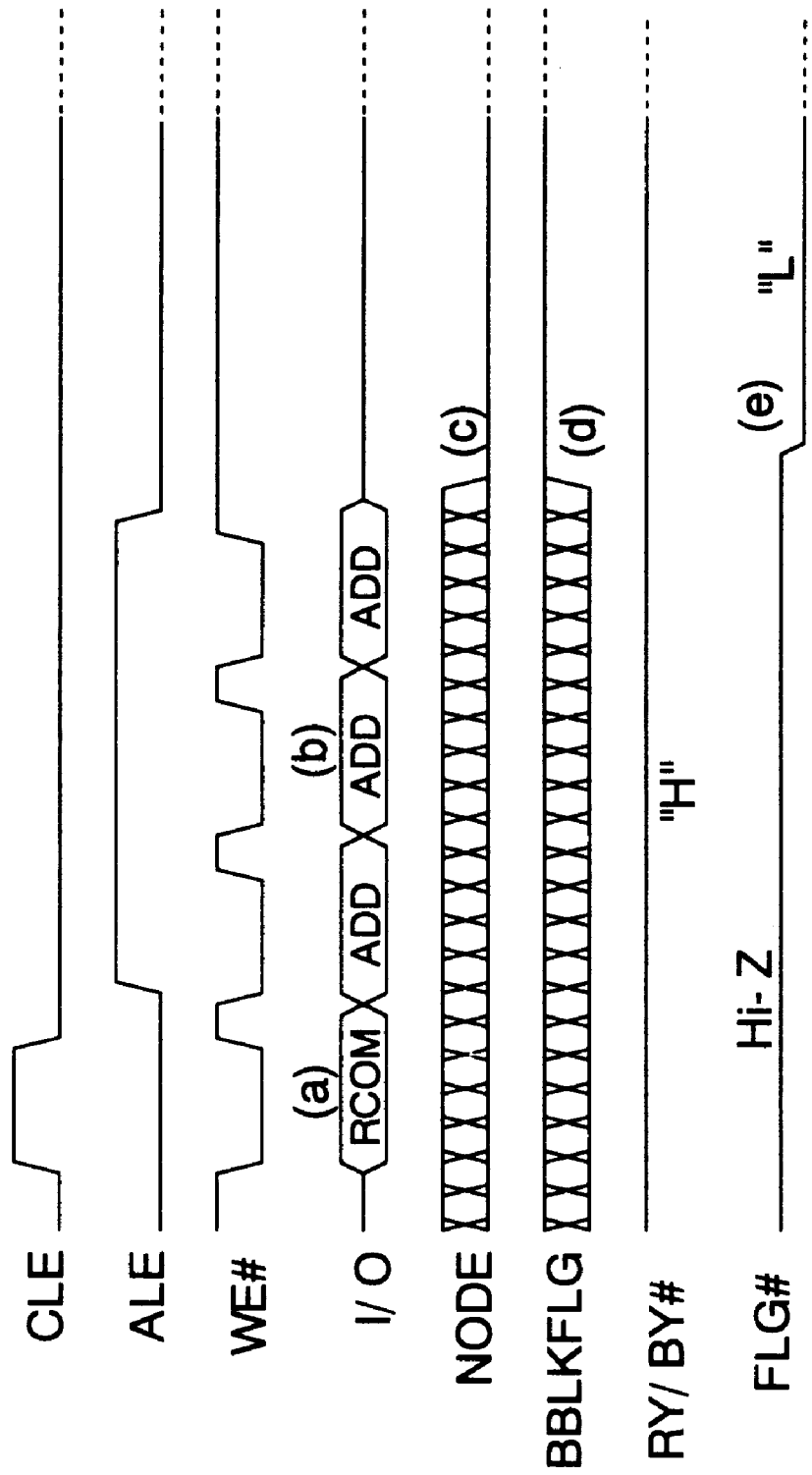
FIG. 9 is a timing chart showing a read operation on a or,bad block in the first embodiment.

FIG. 9 shows the timings of a read operation on a bad block in the flash memory in which the bad block information has been written.

First, the read command RCOM and the read address information (ADD) are fed at the same timings as in FIG. 8 (FIG. 9(a), (b)).

The decoding circuit 48 of the block corresponding to the read address information receives the address signals Zs and activates the XDECSEL signal. The nMOS 52a is turned on upon receiving the XDECSEL signal. Here, in a case where the node NDA is at the high level (indicating the bad block), the nMOS 52b is turned on. Therefore, the level of the node NODE is turned to the low level (FIG. 9(c)). Then, the PMOS 42 shown FIG. 4 is turned on. Since, however, the nMOS's 52a, 52b have a driving capability higher than that of the PMOS 42, the node NODE is not turned to the high level.

The NOR circuit 46 outputs the high level of the BBLKFLG signal upon receiving the low levels of the node NODE and the ENB signal (FIG. 9(d)).

The bad block outputting circuit 12 shown in FIG. 6 has its nMOS 12c turned on upon receiving the low level of the PD signal and the high level of the BBLKFLG signal. Accordingly, the level of the FLG# terminal is turned to the low level (FIG. 9(e)).

Besides, the logic controlling circuit 14 shown in FIG. 3 stops the internal operations upon receiving the high level of the BBLKFLG signal. As a result, the performance of the read operation on the bad block is inhibited. That is, the row address decoder 30 and the logic controlling circuit 14 operate as an access inhibiting circuit which inhibits access to the bad block. Since the read operation is not started, the RY/BY# signal holds the high level to indicate to the exterior that the chip is in the ready status.

Figure 10:
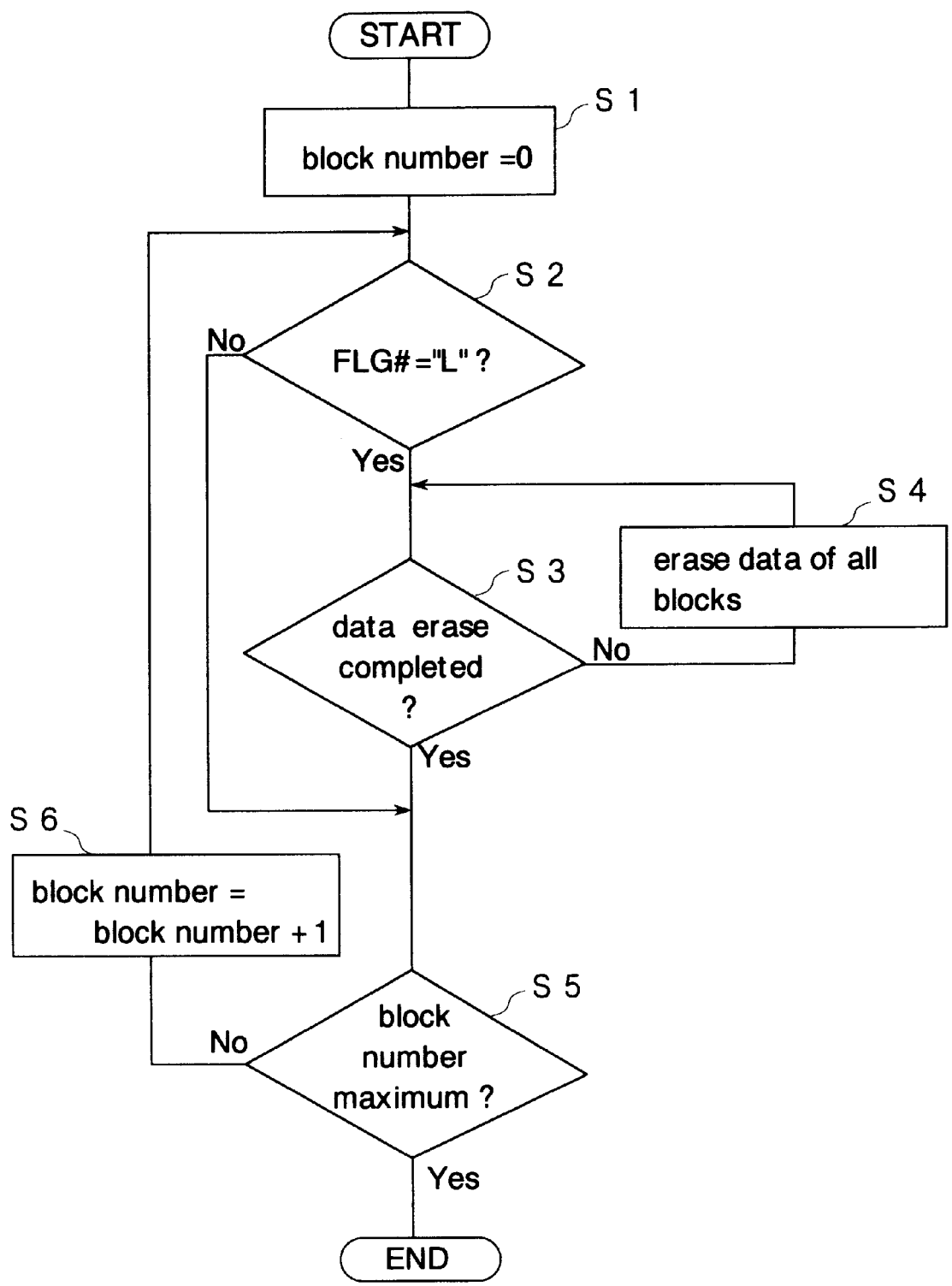
FIG. 10 is a flow chart showing a process for fully erasing data written in a flash memory in the first embodiment.

FIG. 10 shows the flow of the full chip erase of data written in the flash memory.

First, at a step S1, the value of a counter indicating a block number is set at zero.

Subsequently, at a step S2, it is checked if a block indicated by the counter value is a good block. The good block is ensured by the high impedance state of the FLG# terminal. In case of the good block, the procedure of the full chip erase shifts to a step S3. In case of a bad block (FLG# terminal="L"), the procedure skips the step S3 and shifts to a step S5.

At the step S3, it is checked if the data of the good block indicated by the counter value have been erased. In a case where the data have been erased, the procedure shifts to the step S5. In a case where the data have not been erased, the procedure shifts to a step S4.

At the step S4, all the blocks of the flash memory are selected, and the data erase operation thereof is performed. Thereafter, the procedure shifts to the step S3 again.

At the step S5, it is checked if the block number indicated by the counter value is the maximum. In a case where the block number is the maximum, the full chip erase operation is completed. In a case where the block number is not the maximum, the procedure shifts to a step S6.

At the step S6, the counter value is incremented by one, thereby increasing the block number indicated by the counter. Thereafter, the procedure shifts to the step S2 again.

In this manner, not checking the data erase regarding the bad blocks prevents the steps S3 and S4 from being repeatedly executed.

As described above, according to the non-volatile semiconductor memory device of this embodiment, the latching circuit 54 decoding the row address in the decoding circuit 48 can store the bad block information of the corresponding block. In addition, the logic controlling circuit 14 is controlled to stop the internal operations, according to the bad block information. Therefore, the users of the flash memory need not create a bad block table. As a result, it is possible to enhance the usability of the flash memory for file use and reduce the cost of the system mounting the flash memory.

Also comprised are the bad block outputting circuit 12 and the flag terminal FLG#, which notifies to the exterior that the bad block has been accessed. Therefore, the system mounting the flash memory can readily obtain the bad block information without any special control table or the like. In other words, it is possible to readily detect the inhibition of a read operation or the like due to the occurrence of access to the bad block.

Figure 11:
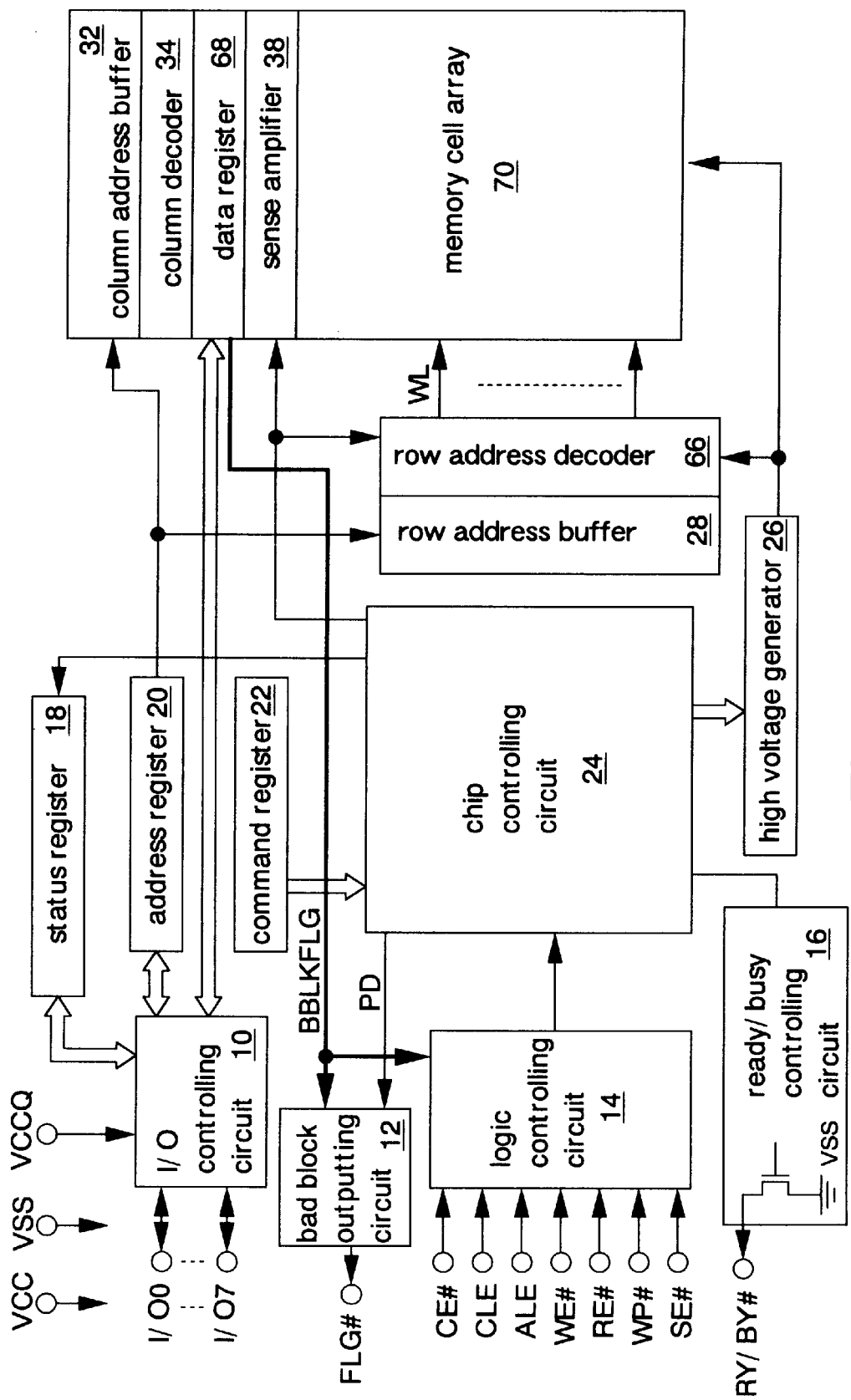
FIG. 11 is a block diagram showing the second embodiment.

FIG. 11 shows the second embodiment of the non-volatile semiconductor memory device in the present invention. Incidentally, the same symbols are respectively assigned to the same circuits as in the first embodiment, and these circuits shall be omitted from detailed description.

This embodiment differs from the first embodiment in a row address decoder 66, a data register 68 and a memory cell array 70. A BBLKFLG signal is outputted from the data register 68. The remaining construction is the same as in the first embodiment.

Figure 12:
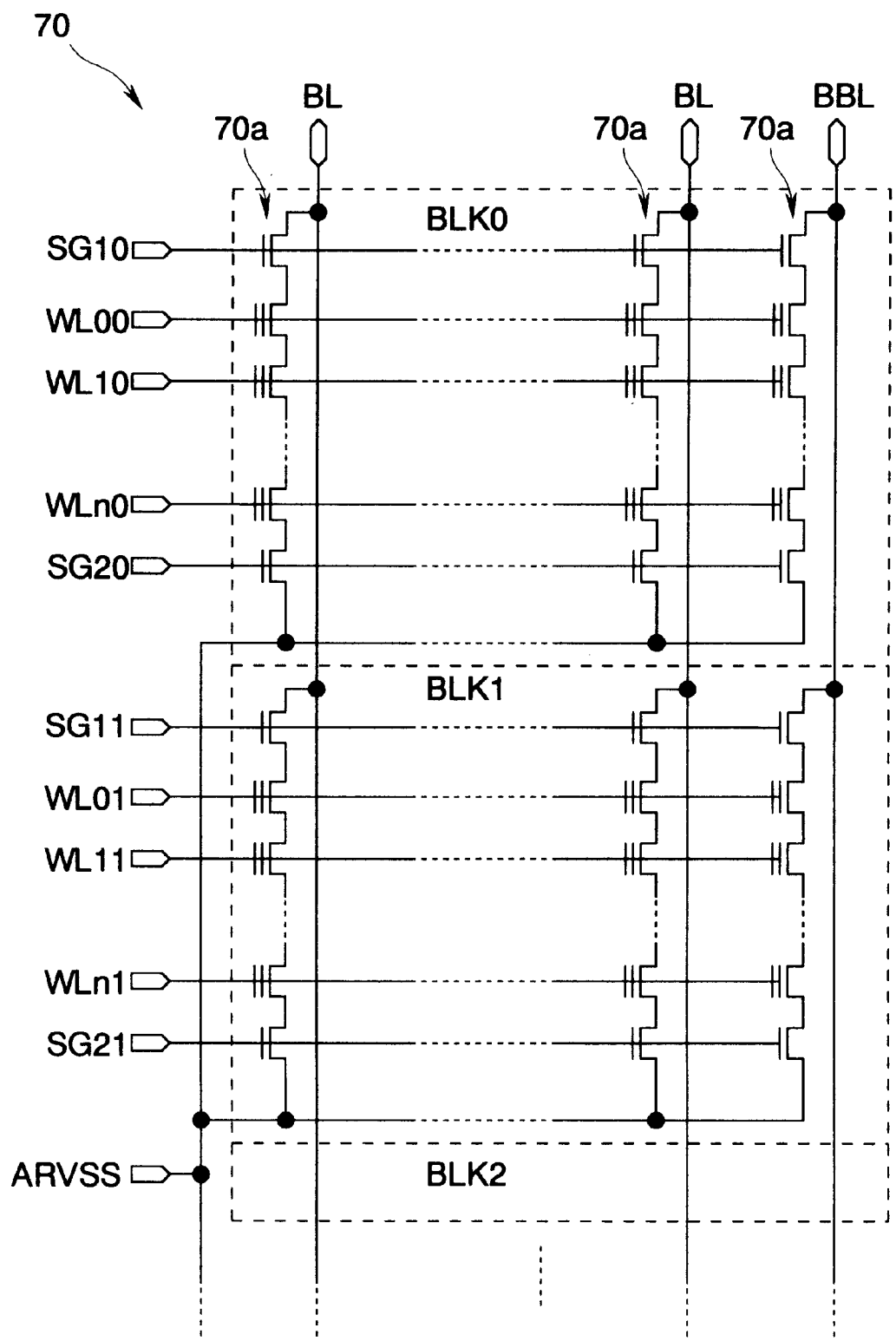
FIG. 12 is a circuit diagram showing the details of a memory cell array shown in FIG. 11.

FIG. 12 shows the details of the memory cell array 70.

The memory cell array 70 is constructed of a plurality of blocks BLK. Each of the blocks BLK includes a plurality of memory cell columns 70a of NAND type. Each of the memory cell columns 70a is formed by connecting a plurality of memory cells in series between selecting transistors. Each of the memory cells has a controlling gate and a floating gate likewise to a memory cell in the prior art. Word lines WL are respectively connected to the controlling gates of the memory cells. Selecting lines SG are respectively connected to the gates of the selecting transistors.

In addition, the rightmost memory cell column 70a in the figure is used as the cells for storing bad block information. The other memory cell columns 70a are used for storing data. Both the ends of each of the memory cell columns 70a are respectively connected to a bit line BL (or BBL) and a controlling line ARVSS. Here, the bit line BBL is a signal line for transmitting the bad block information to the data register 68.

A write operation on the memory cell is performed by injecting electrons from the channel of the memory cell into the floating gate thereof in such a way that a high voltage (for example, 18V) is supplied to the word line WL corresponding to the memory cell and a low voltage (for example, 0V) to the bit line BL (or BBL).

A read operation on the memory cell is performed in such a way that the low voltage (for example, 0V) is supplied to the word line WL corresponding to the memory cell, that a high level (for example, 4V) is supplied to the other word lines WL and the selecting lines SG and the low voltage (for example, 0V) to the controlling line ARVSS. When electrons are accumulated in the floating gate (in a written state), the channel is not formed in the memory cell, and the voltage of the controlling line ARVSS is not transmitted to the bit line BL. In contrast, when electrons are not accumulated in the floating gate (in an erased state), the channel is formed in the memory cell, and the voltage of the controlling line ARVSS is transmitted to the bit line BL.

An erase operation on the memory cell is performed by emitting electrons accumulated in the floating gate, in such a way that the low voltage (for example, 0V) is supplied to the controlling gate of the memory cell, and that a high voltage (for example, 20V) is supplied to the well region of the memory cells. At this point, the controlling gates of the memory cells whose data are not to be erased are held in, for example, floating states.

Figure 13:
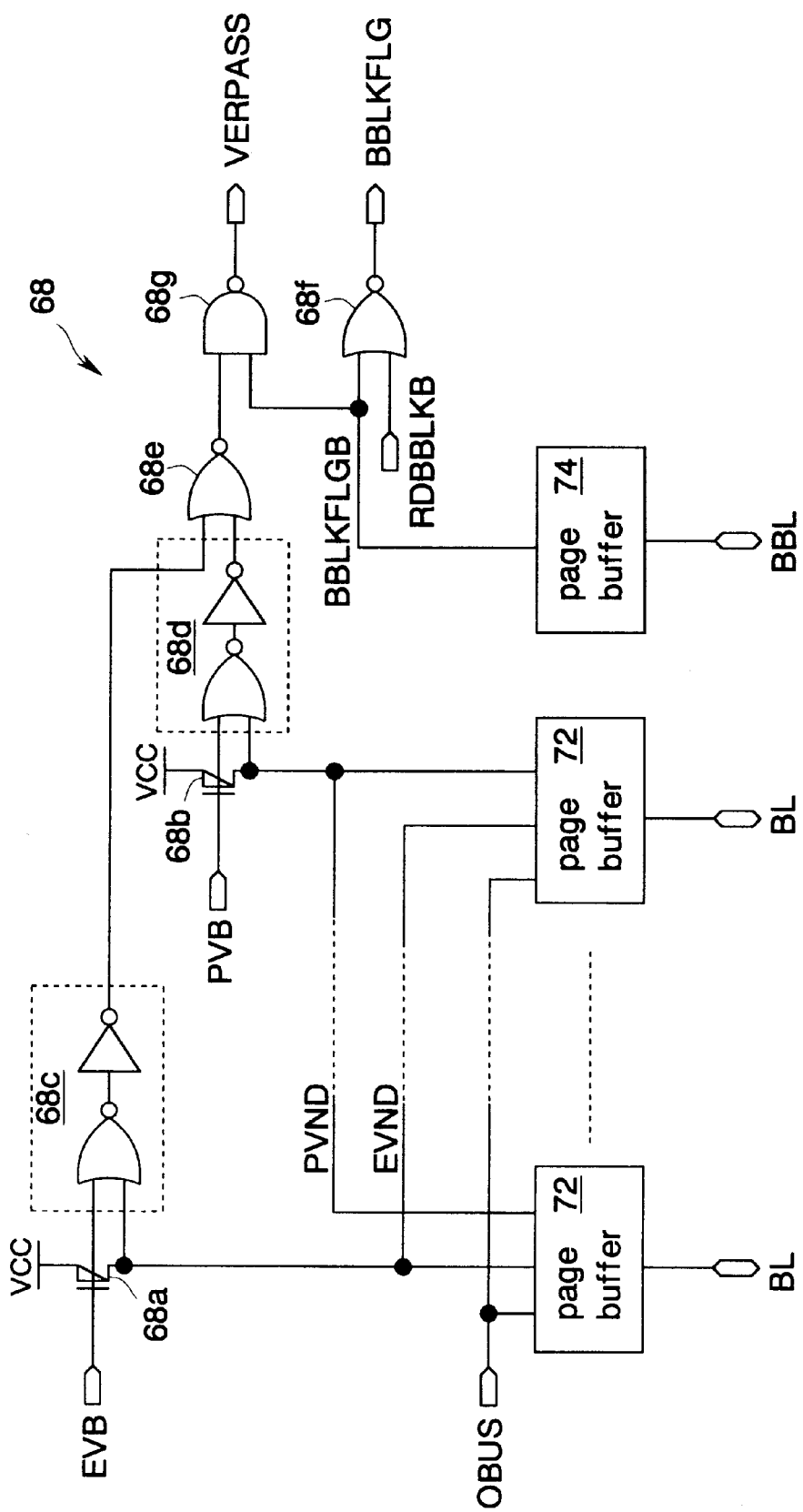
FIG. 13 is a circuit diagram showing the details of a data register shown in FIG. 11.

FIG. 13 shows the details of the data register 68.

The data register 68 includes a plurality of page buffers 72, a single page buffer 74, and a plurality of transistors and logical gates for detecting the states of the write operation and the read operation. The bit lines BL, an outputting data-bus line OBUS, a write verification node PVND and an erase verification node EVND are respectively connected to the page buffers 72. The bit line BBL and a bad block flag signal BBLKFLGB are connected to the page buffer 74. The page buffer 74 is used for transmitting the information of a bad block.

When an erase verification controlling signal EVB is at its low level, the pMOS 68a is turned on to feed a supply voltage VCC to the node EVND. When a write verification controlling signal PVB is at its low level, the PMOS 68b is turned on to feed the supply voltage VCC to the node PVND.

The OR gate 68c receives the EVB signal and the voltage of the node EVND, and it has its output end connected to one input end of the NOR gate 68e. The OR gate 68d receives the PVB signal and the voltage of the node PVND, and it has its output end connected to the other input end of the NOR gate 68e. The NAND gate 68g outputs the high level of a verification pass signal VERPASS when the OR gate 68c is at high level(the completion of the erase operation), the OR gate 68d at high level (the completion of the write operation), and the BBLKFLGB signal at high level (access to the bad block). The VERPASS signal is outputted to a chip controlling circuit 24. The NOR gate 68f outputs the high level of a BBLKFLG signal when a read bad block signal RDBBLKB and the BBLKFLGB signal are both at the low level.

Figure 14:
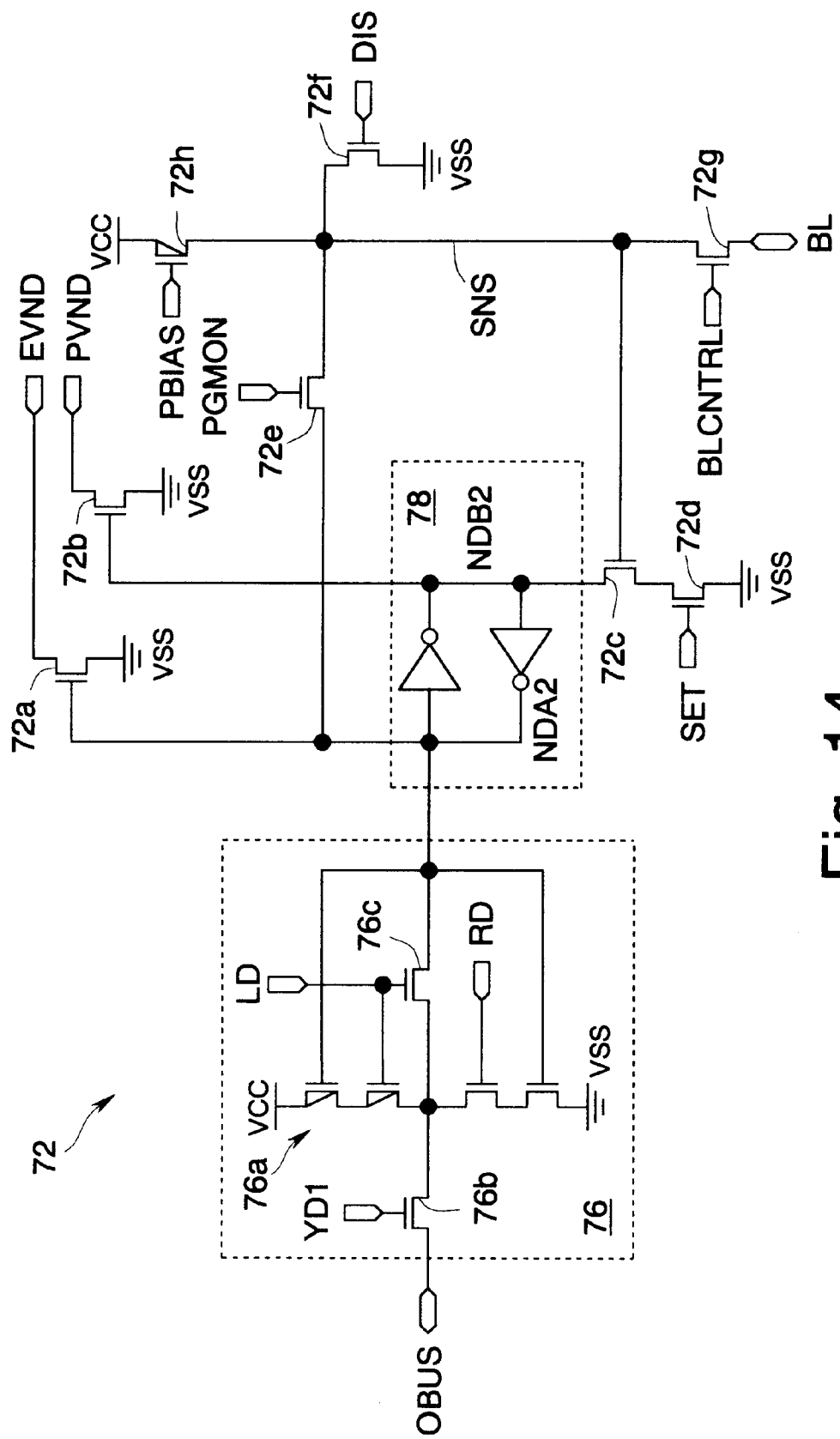
FIG. 14 is a circuit diagram showing the details of a page buffer shown in FIG. 13.

FIG. 14 shows the details of each of the page buffers 72.

The page buffer 72 includes an output circuit 76, a latching circuit 78, and a plurality of controlling transistors. Signals which control these controlling transistors are outputted from the chip controlling circuit 24 shown in FIG. 11. The output circuit 76 is configured of a clocked inverter 76a, and transmission gates 76b and 76c each being formed of an nMOS. The clocked inverter 76a is controlled by a loading signal LD and a reading signal RD. The transmission gate 76b is controlled by a controlling signal YD1, and it outputs data held in the latching circuit 78, to the outputting data-bus line OBUS through the clocked inverter 76a. The transmission gate 76c is controlled by the loading signal LD, and it transmits the data of the outputting data-bus line OBUS to the latching circuit 78.

The latching circuit 78 is the same circuit as the latching circuit 54 shown in FIG. 5. This latching circuit 78 holds erase verification information or write verification information at nodes NDA2 and NDB2. When the node NDA2 is at the high level, the nMOS 72a is turned on, and the node EVND is turned to the low level. Also, when the node NDB2 is at the high level, the nMOS 72b is turned on, and the node PVND is turned to the low level.

The node NDB2 is connected to a ground line VSS through the nMOS's 72c, 72d which are connected in series. The gate of the nMOS 72c is connected to a node SNS, and that of the nMOS 72d receives a SET signal.

The nMOS 72e connects the nodes NDA2, SNS to each other when a writing signal PGMON is at high level. The nMOS 72f holds the node SNS at the low level when a discharging signal DIS is at high level. The nMOS 72g connects the bit line BL and the node SNS when a bit line controlling signal BLCNTRL is at high level. The PMOS 72h feeds the supply voltage VCC to the node SNS when a bias controlling signal PBIAS is at low level.

Figure 15:
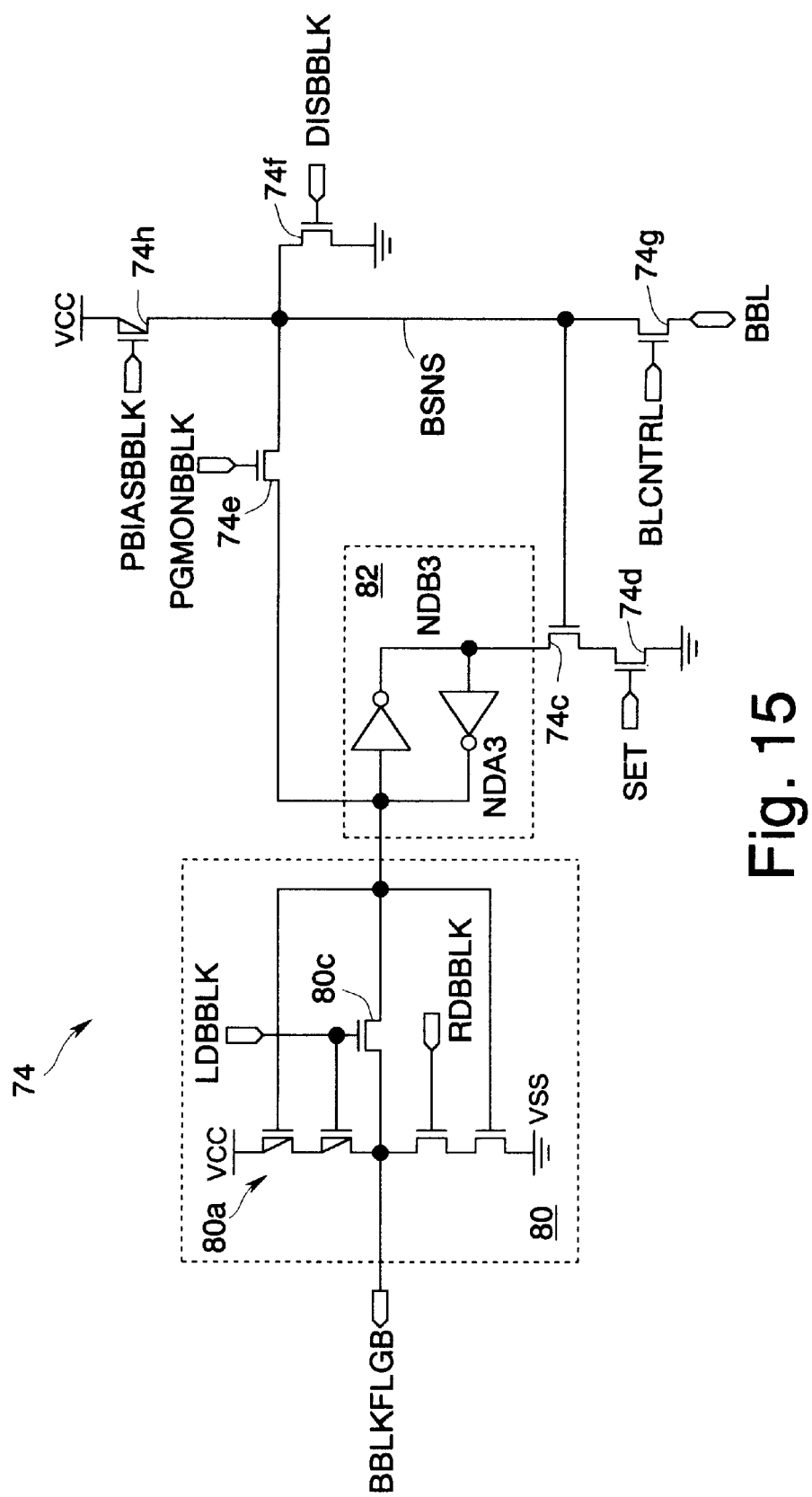
FIG. 15 is a circuit diagram showing the details of another page buffer shown in FIG. 13.

FIG. 15 shows the details of the page buffer 74.

The page buffer 74 includes an output circuit 80, a latching circuit 82, and a plurality of controlling transistors. Signals which control these controlling transistors are outputted from the chip controlling circuit 24 shown in FIG. 11. The output circuit 80 is so constructed that the nMOS 76b is removed from the output circuit 76 shown in FIG. 14. The clocked inverter 80a of the output circuit 80 is controlled by a loading signal LDBBLK and a reading signal RDBBLK. The transmission gate 80c of the output circuit 80 is controlled by the LDBBLK signal, and it transmits the BBLK-FLGB signal to the latching circuit 82.

The latching circuit 82 is the same as the latching circuit 78 shown in FIG. 14. This latching circuit 82 holds complementary bad block information at nodes NDA3 and NDB3.

The node NDB3 is connected to the ground line VSS through the nMOS's 74c and 74d which are connected in series. The gate of the NMOS 74c is connected to a node BSNS, and that of the in MOS 74d receives the SET signal.

The nMOS 74e connects the nodes NDA3 and BSNS to each other when a writing signal PGMONBBLK is at high level. The nMOS 74f holds the node BSNS at the low level when a discharging signal DISBBLK is at high level. The nMOS 74g connects the bit line BBL and the node BSNS when the bit line controlling signal BLCNTRL is at high level. The pMOS 74h feeds the supply voltage VCC to the node BSNS when a bias controlling signal PBIASBBLK is at low level.

Next, the operation of the flash memory will be described according to this embodiment.

The flash memory has, in advance, all the cells for storing bad block information of bad blocks set in a written state and all the cells for storing the information of good blocks set in an erased state. In this embodiment, the bad block information is held in the non-volatile memory cells. Therefore, the write operation and the erase operation on the cells for storing the bad block information can be performed by the manufacturer of the flash memory unlike those in the prior art. As a result, the users of the flash memory need not create a bad block table of the prior art. This results in drastically reducing the workload of users.

Figure 16:
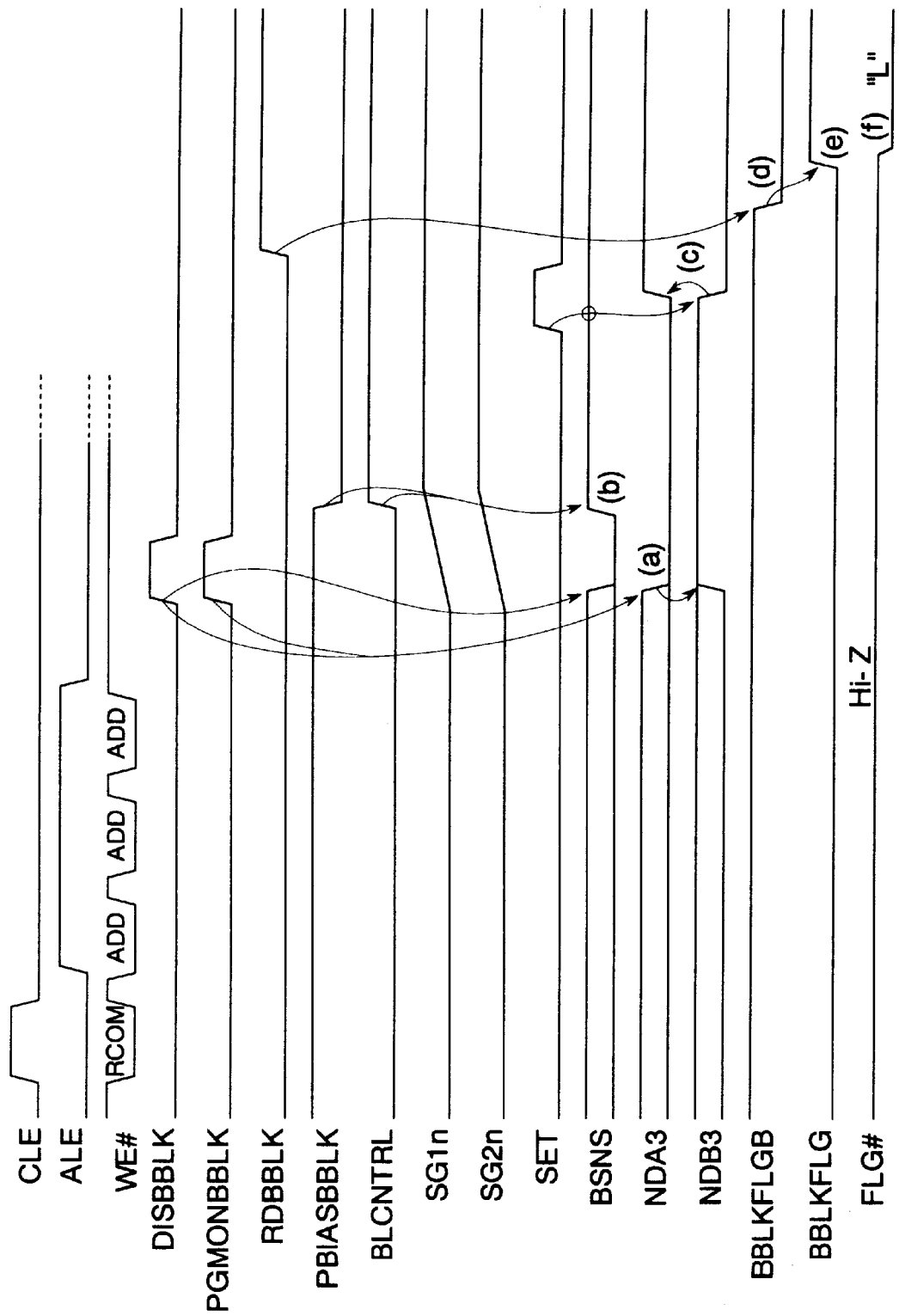
FIG. 16 is a timing chart showing a read operation on a bad block in the second embodiment.

FIG. 16 shows the timings of a read operation on a bad block.

First, a read command RCOM and read address information (ADD) are fed at the same timings as in FIG. 8.

Thereafter, the DISBBLK signal and PGMONBBLK signal are activated (the high level), the nMOS's 74f and 74e shown in FIG. 15 are turned on, and the nodes BSNS, NDA3 are turned to the low level (FIG. 16(a)).

Subsequently, selecting signals SG are turned to the high level, the PBIASBBLK signal is activated (the low level), and the BLCNTRL signal is activated (the high level). The node BSNS is fed with the supply voltage VCC, while at the same time, the bad block information is transmitted from the memory cell kw array 70 to the node BSNS through the bit line BBL. Note that this example illustrates the read operation on the bad block but in an actual operation the bit line BBL of the memory cell array 70 is set to be in a floating state. Therefore, the node BSNS is turned to the high level (FIG. 16(b)).

Subsequently, the SET signal is activated (the high level), the node NDB3 is turned to the low level, and the node NDA3 is turned to the high level (FIG. 16(c)).

Subsequently, the RDBBLK signal is activated (the high level), and the low level of the BBLKFLGB signal (the inverted data of the data at the node NDA3) is outputted (FIG. 16(d)).

The NOR gate 68f shown in FIG. 13 outputs the high level of the BBLKFLG signal upon receiving the low levels of the BBLKFLGB signal and the RDBBLKB signal (FIG. 16(e)). Then, a bad block outputting circuit 12 shown in FIG. 11 turns the level of an FLG# terminal to the low level in the same manner as in the first embodiment (FIG. 16(f)).

Figure 17:
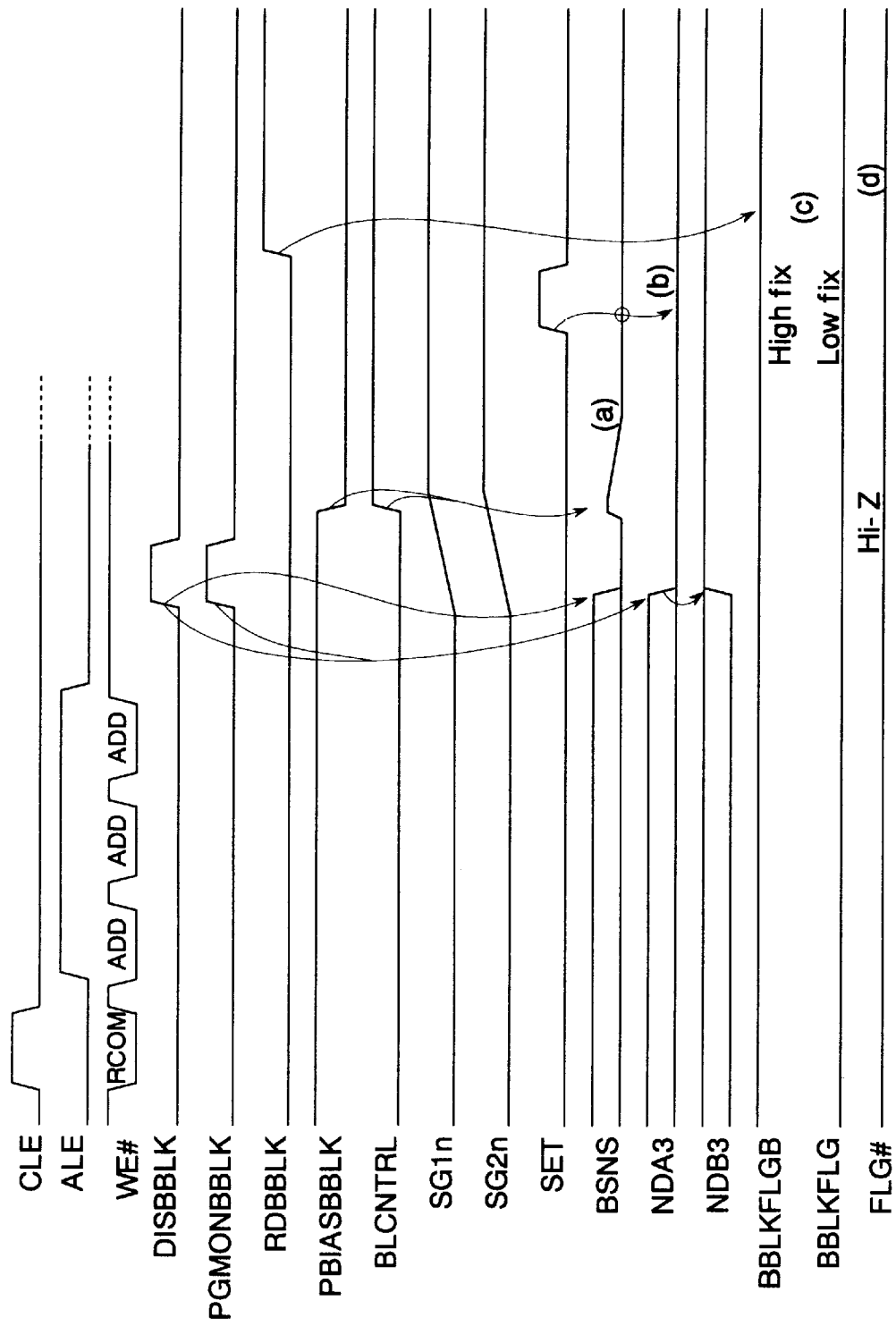
FIG. 17 is a timing chart showing a read operation on a good block in the second embodiment.

FIG. 17 shows the timings of a read operation on a good block. Here, only the timings different from those in FIG. 16 will be explained.

When the PBIASBBLK signal and the BLCNTBL signal have been activated, the supply voltage VCC is fed to the node BSNS. Simultaneously, bad block information (low level) is transmitted from the memory cell array 70 to the node BSNS through the bit line BBL. Therefore, the node BSNS is turned to the low level (FIG. 17(a)).

Subsequently, the SET signal is activated. At this point, the levels of the nodes NDB3, NDA3 are not varied since the nMOS 74c shown in FIG. 15 is off (FIG. 17(b)).

Subsequently, the RDBBLK signal is activated, and the high level of BBLKFLGB signal (the inverted data of the data at the node NDA3) is outputted (FIG. 17(c)). That is, the level of the BBLKFLGB signal is not turned. As a result, the BBLKFLGB signal is held at high level and the FLG# terminal is held in a high-impedance state Hi-Z (FIG. 17(d)).

Figure 18:
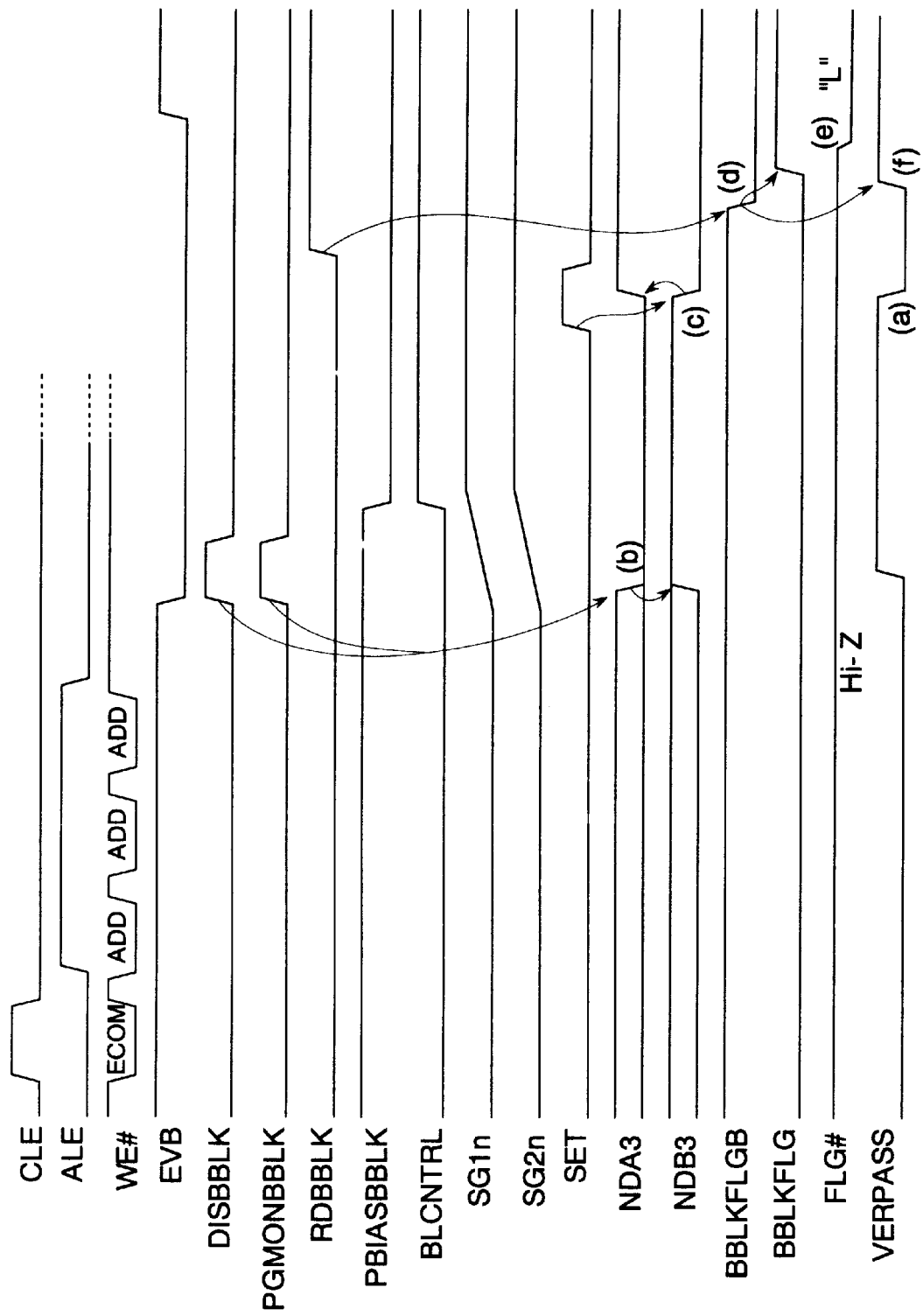
FIG. 18 is a timing chart showing an erase operation on a bad block in the second embodiment.

FIG. 18 shows the erase operation timings for a bad block.

First, an erase command ECOM and read address information (ADD) are fed at the same timings as in FIG. 8.

Subsequently, the EVB signal is activated (the low level). The VERPASS signal is turned in accordance with the erased state of the block as is transmitted from each page buffer 72 to the node EVND. In this example, the block is incompletely erased, and hence, the VERPASS signal is turned to the low level after a predetermined time (FIG. 18(a)).

Besides, in the same manner as in FIG. 16, the DISBBLK signal and PGMONBBLK signal are activated, and the nodes BSNS, NDA3 are turned to the low level (FIG. 18(b)). The SET signal is activated (the high level), the node NDB3 is turned to the low level, and the node NDA3 is turned to the high level (FIG. 18(c)). The RDBBLK signal is activated, and the low level of the BBLKFLGB signal is outputted (FIG. 18(d)). Then, the level of the FLG# terminal is turned to the low level (FIG. 18(e)).

The NAND gate 68g shown in FIG. 13 turns the VERPASS signal to the high level upon receiving the low level of the BBLKFLGB signal (FIG. 18(f)). That is, the data register 68 forcibly turns the VERPASS signal to the high level during the erase operation on the bad block. The chip controlling circuit 24 forcibly terminates the erase operation upon receiving the VERPASS signal. As a result, an RY/BY# terminal becomes a ready status (high level). A system mounting the flash memory inputs the next command to the flash memory upon receiving the ready status.

Figure 1:
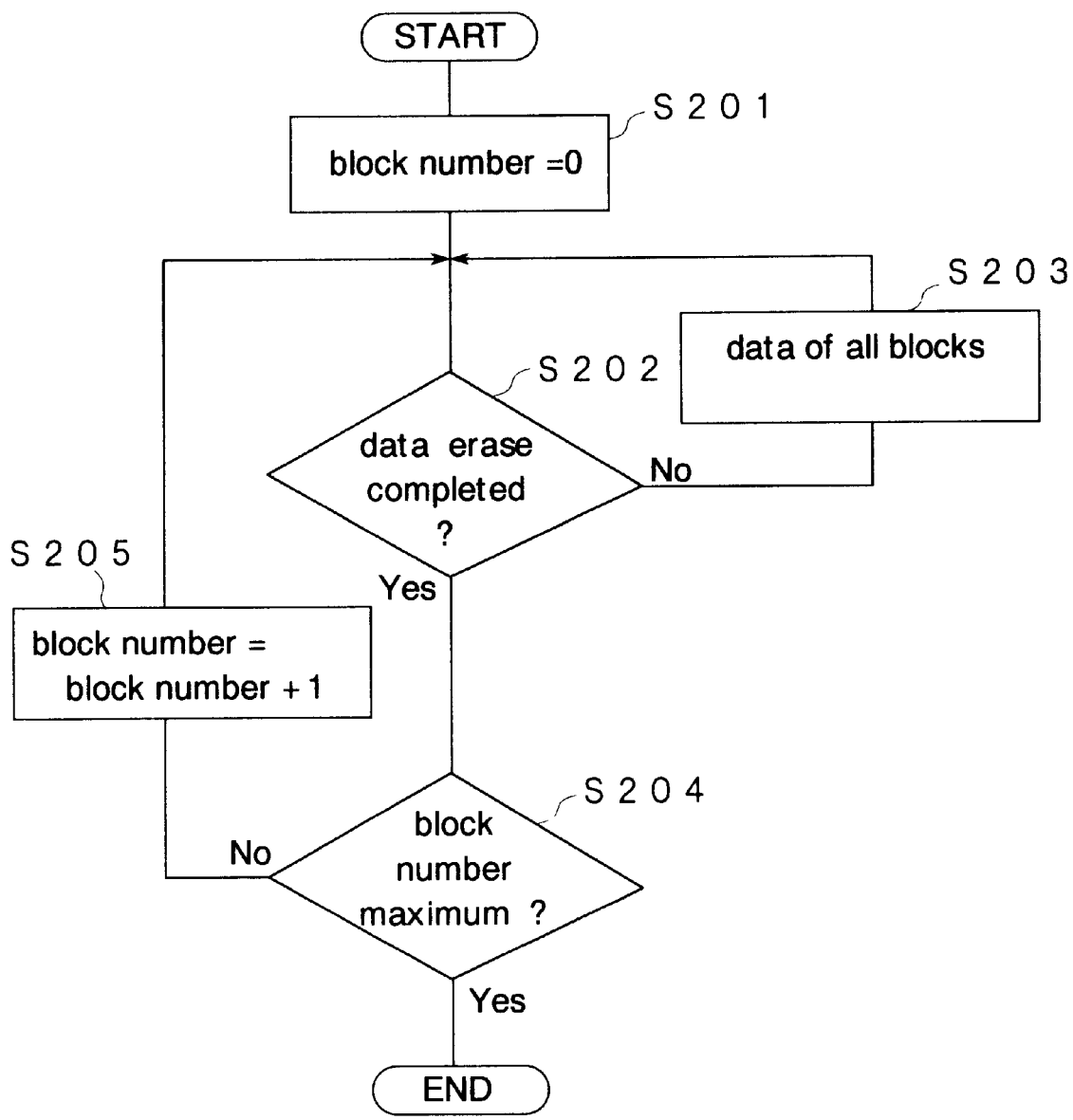
FIG. 1 is a flow chart showing a process of fully erasing data written in a flash memory in the prior art.
Figure 2:
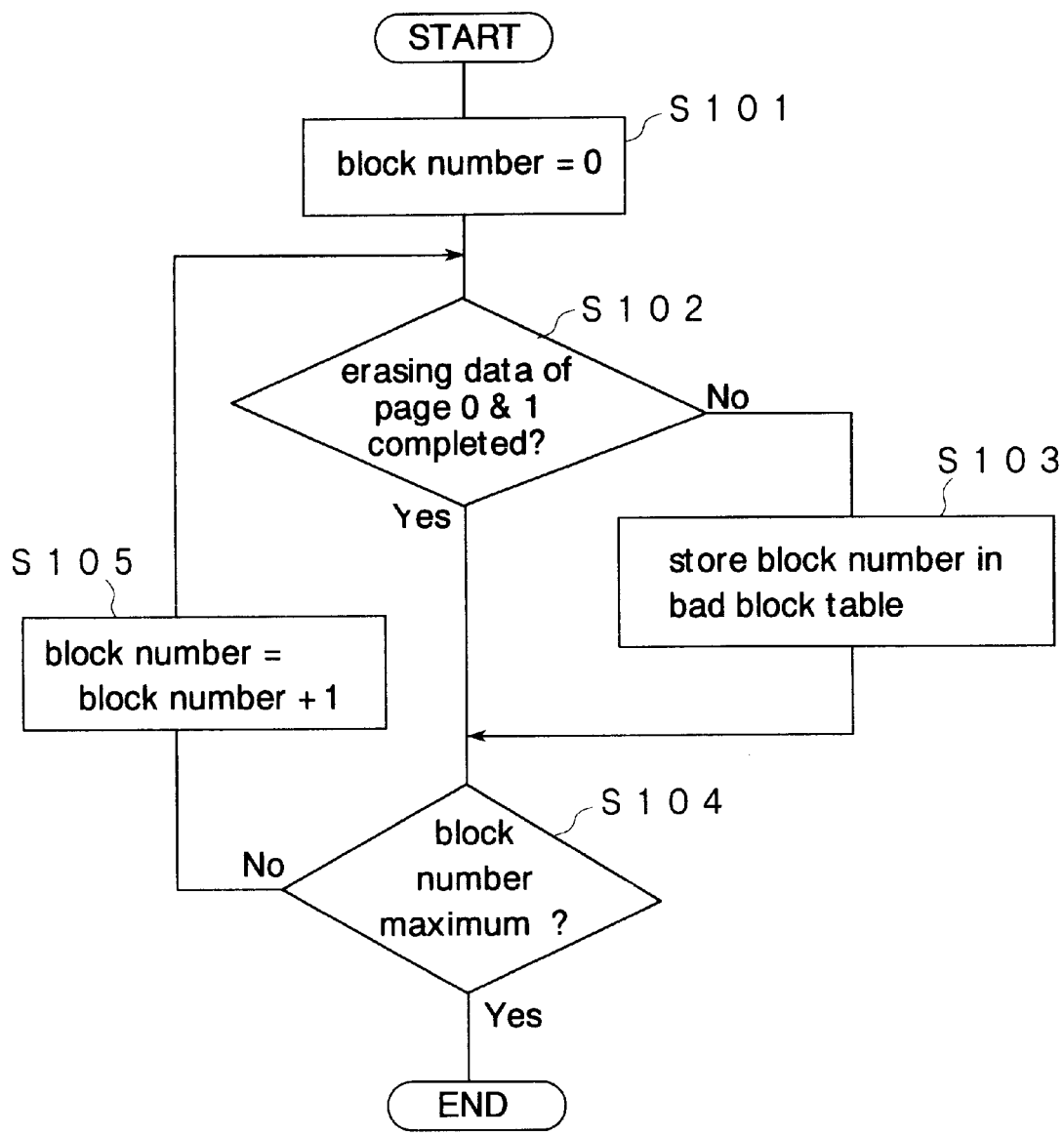
FIG. 2 is a flow chart showing a process of creating a bad block table in the prior art.

By way of example, the system can fully erase the data of the flash memory by repeatedly performing the erase operation above. At this point, the erase operation on the bad block is forcibly passed. Accordingly, the system can use the full chip erase flow of the prior art shown in FIG. 1.

Incidentally, in this embodiment, a write inhibiting operation to a bad block is performed in the same way as in the first embodiment. Further, the erase operation can be inhibited for every page in such a way that only the cells for storing the block information corresponding to actual bad pages in the bad block are turned into the written state.

Figure 19:
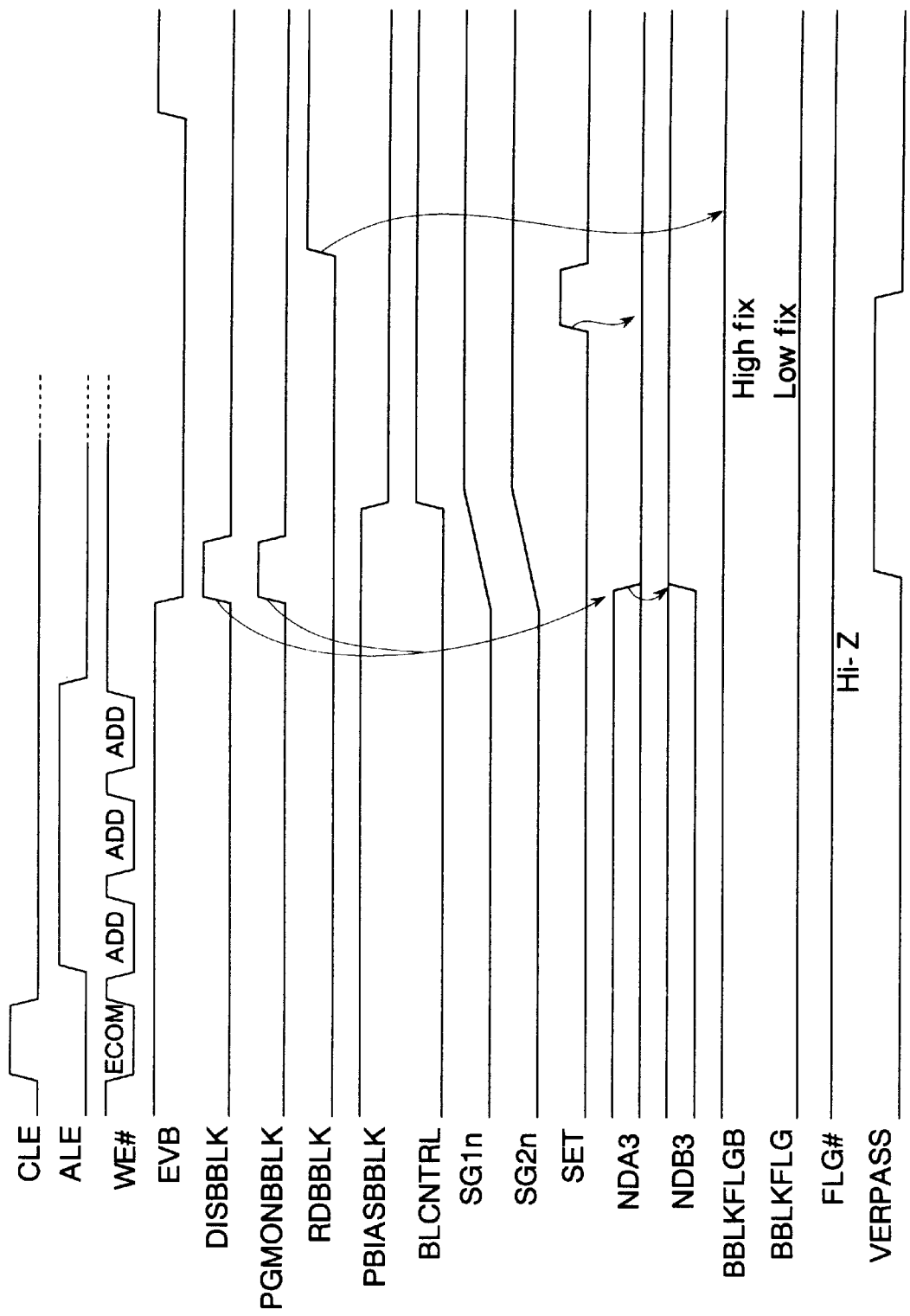
FIG. 19 is a timing chart showing an erase operation on a good block in the second embodiment.

FIG. 19 shows the operation timings of erasing a good block. In case of the good block, the BBLKFLGB signal is not activated (the low level), and hence, the VERPASS signal is not forcibly turned to the high level. That is, the VERPASS signal is turned in accordance with an actual erased state of the memory cell. Accordingly, the erase operation is subsequently performed.

Also in this embodiment, the same effects as in the foregoing first embodiment can be attained. Further, in this embodiment, the bad block information is stored in the non-volatile memory cells. Therefore, the bad block information can be held in the chip independent of the switch-on/off of a power supply. By way of example, after a probing test on a wafer or a classification test of a package, the bad block information can be stored in the memory cells by utilizing the results of the tests. That is, the bad block information can be stored in the chip in advance before the shipment of the flash memory. Therefore, users of the flash memory need not create a bad block table or the like, which results in greatly improving the usability of users.

In addition, the memory cell for storing the bad block information is formed in every page of each block of the memory cell array. Therefore, writing and erasing the bad block information can be performed similarly to the normal operations. As a result, this makes it possible to easily form circuits for controlling the bad block information. Here, the defect information can be controlled with the page set as one unit (the memory cell unit) by writing and erasing the bad block information for every page.

Besides, the verification pass signal VERPASS is forcibly changed onto the pass side when the bad block has been accessed. Therefore, the system on which the flash memory is mounted can obtain the information of verification pass irrespective of the completion of the actual erase operation when the bad block has been accessed in the erase operation. It is therefore avoidable that the erase operation on the bad block fails to be completed forever as in the prior art. Especially, in a process of fully erasing a plurality of blocks, the process can be prevented from aborting (due to time-out ascribable to the situation where the process does not terminate).

Figure 20:
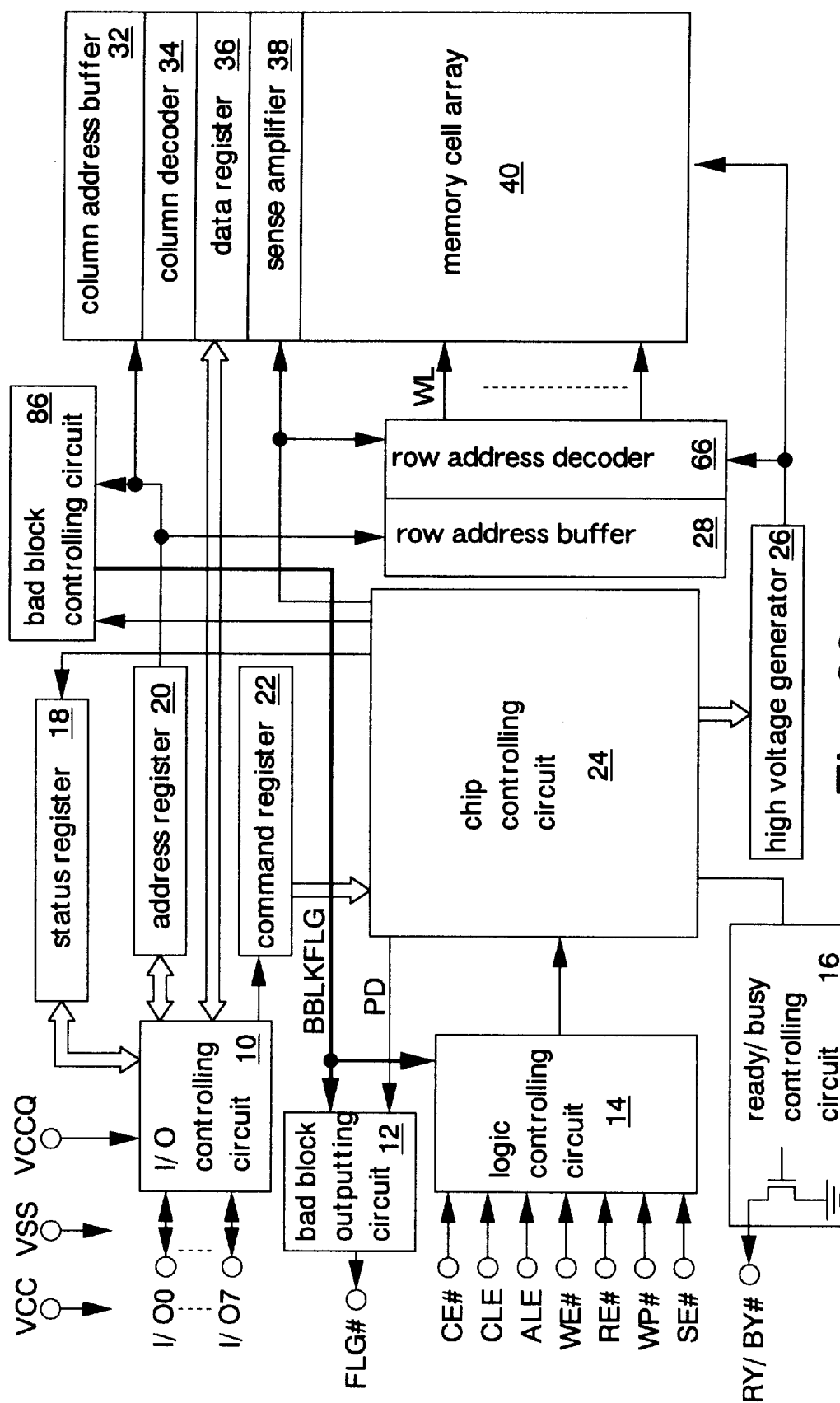
FIG. 20 is a block diagram showing the third embodiment.

FIG. 20 shows the third embodiment of the non-volatile semiconductor memory device in the present invention. Incidentally, the same symbols are respectively assigned to the same circuits as in the first and second embodiments, and these circuits shall be omitted from detailed description.

In this embodiment, a bad block controlling circuit 86 which outputs a BBLKFLG signal is formed anew. The remaining construction is the same as in the first or second embodiment.

Figure 21:
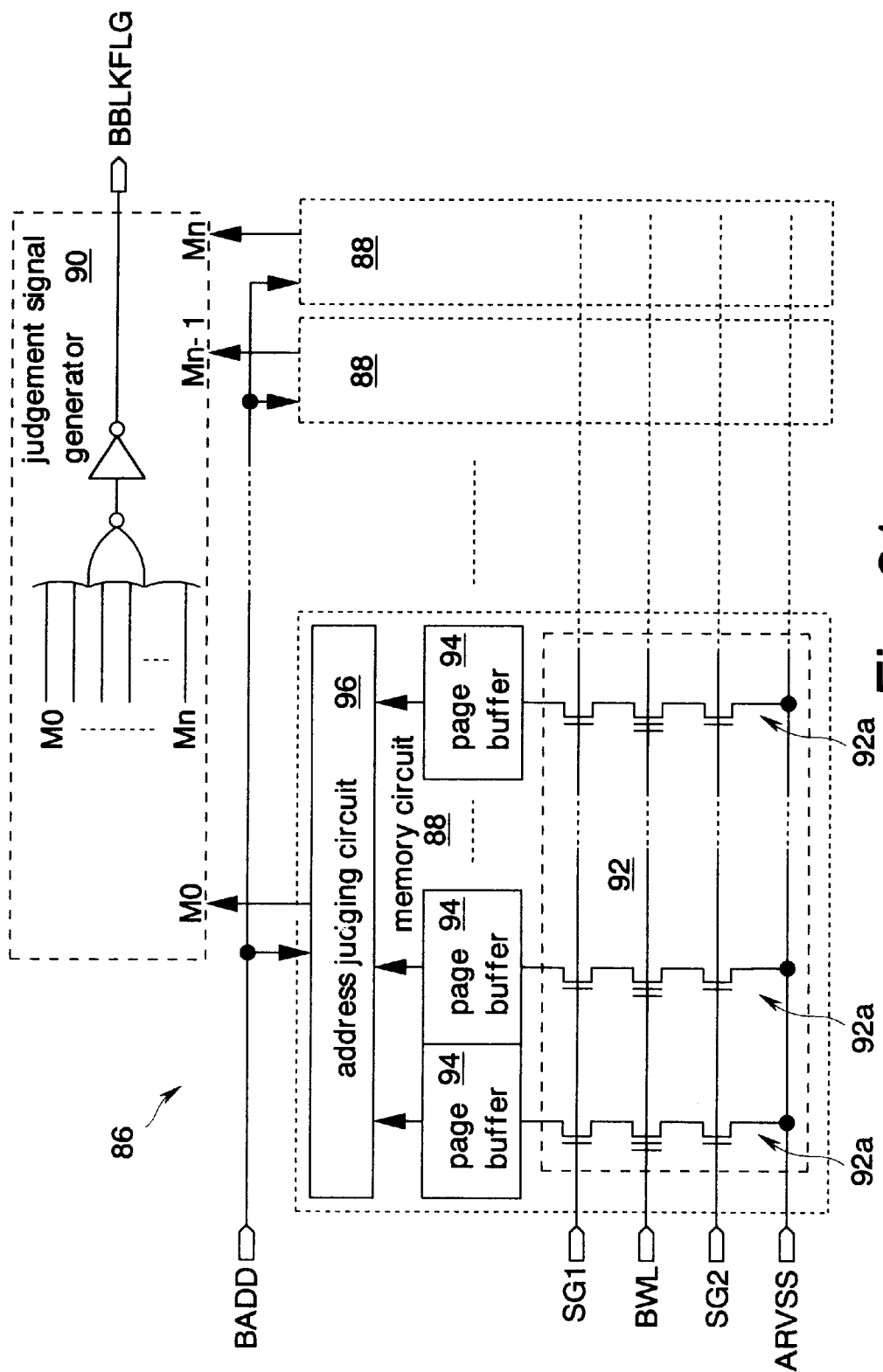
FIG. 21 is a circuit diagram showing the details of a bad block controlling circuit shown in FIG. 20.

FIG. 21 shows the details of the bad block controlling circuit 86.

The bad block controlling circuit 86 includes a plurality of memory circuits 88 for storing bad block addresses therein, and a judgement signal generator 90 for bad blocks. The memory circuits 88 are formed in the same number as the maximum number of bad blocks which are allowed for the flash memory.

Each of the memory circuits 88 is constructed of a storage unit 92 for storing the bad block addresses therein, page buffers 94, and an address judging circuit 96. The storage unit 92 includes a plurality of memory cell columns 92a corresponding to the number of row addresses which are necessary for selecting individual blocks. By way of example, in a case where the flash memory has 1024 blocks, ten memory cell columns 92a are formed. Each of the memory cell columns 92a is constructed by connecting selecting transistors on both the sides of one non-volatile memory cell. Each of such memory cells stores one bit of the bad block address therein. A word line BWL is connected to the controlling gates of the memory cells. Selecting lines SG1, SG2 are respectively connected to the gates of the selecting transistors. One end of the memory cell column 92a is connected to the corresponding page buffer 94, while the other end thereof is connected to a controlling line ARVSS.

The address judging circuit 96 receives a block address signal BADD directly, and data stored in each memory cell, through the corresponding page buffer 94, and it compares them and then outputs a judgement signal Mn.

The judgement signal generator 90 is constructed of an OR circuit. The OR circuit activates (to a high level) the BBLKFLG signal when any of the judgement signals M0–Mn from the address judging circuits 96 is at the high level (indicating the bad block).

Figure 22:
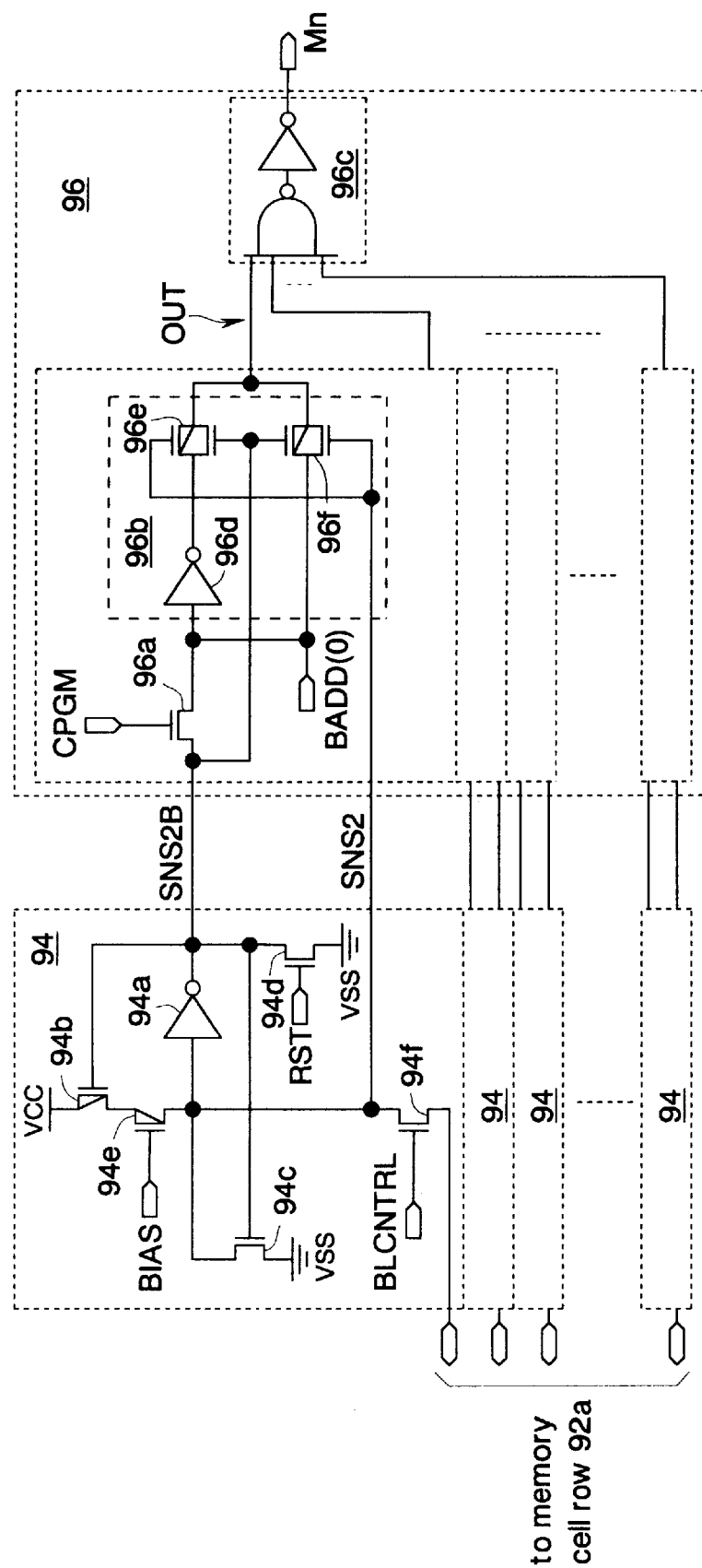
FIG. 22 is a circuit diagram showing the details of page buffers and an address judging circuit shown in FIG. 21.

FIG. 22 shows the details of the page buffer 94 and the address judging circuit 96.

The page buffer 94 is configured of an inverter 94a, a pMOS 94b and an nMOS 94c which latch data from the corresponding memory cell, an nMOS 94d which resets the latch, and a pMOS 94e and an nMOS 94f by which data is accepted into the latch. The nMOS 94d, pMOS 94e and nMOS 94f are respectively controlled an RST signal, a bias controlling signal BIAS and a BLCNTRL signal. The page buffer 94 amplifies the data from the memory cell as is transmitted to a node SNS2 through the nMOS 94f, and it latches the amplified data. The latched data is held at the node SNS2 and a node SNS2B.

The address judging circuit 96 is configured of a plurality of nMOS transmission gates 96a, ENOR circuits 96b and AND circuits 96c which correspond to the respective page buffers 94.

The ENOR circuit 96b is constituted by an inverter 96b, and CMOS transmission gates 96e and 96f. This ENOR circuit 96b compares the data from the page buffer 94 and a block address signal BADD at the corresponding bit. When the data and the BADD signal are equal, that is, when one bit of the block address coincides with one bit of the bad block address, the ENOR circuit 96b turns an output node OUT to the high level. When the block address and the bad block address coincide, the AND circuit 96c outputs the address coincidence signal Mn.

Next, the operation of the flash memory of this embodiment will be described.

The bad block addresses are respectively written into the corresponding memory circuits 88 beforehand. Concretely, the memory cells corresponding to the bits "1" of the bad block address are subjected to writing, whereas the memory cells corresponding to the bits "0" are subjected to erasing. The write operation and the erase operation are performed by, for example, the manufacturer of the flash memory as in the second embodiment.

Besides, before the flash memory starts its ordinary operation, the bad block information stored in the memory cell columns 92a need to be latched into the respectively corresponding page buffers 94 of the bad block controlling circuit 86.

Figure 23:
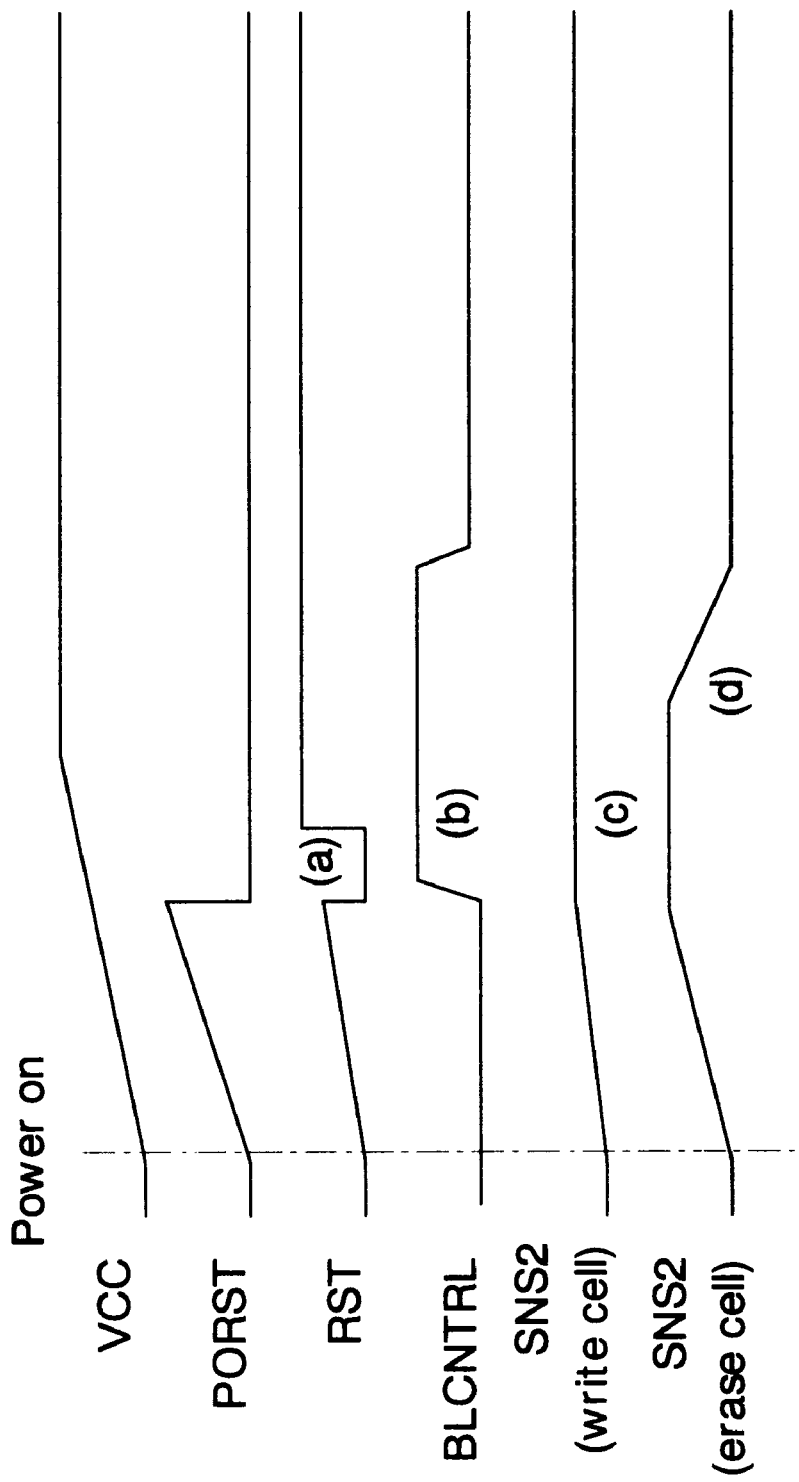
FIG. 23 is a timing chart showing the operation of latching bad block information into the page buffer when power is switched on, in the third embodiment.

FIG. 23 shows the timings of latching the bad block information when power is switched on, by way of example.

First, the power supply of a system on which the flash memory is mounted is switched on, and a supply voltage VCC rises. When the supply voltage VCC has reached a predetermined value, the power-on reset signal PORST of a power supply monitoring circuit (not shown) included in the flash memory is turned to low level (FIG. 23(a)). Upon receiving the low level of the PORST signal, a chip controlling circuit 24 shown in FIG. 20 outputs the RST signal (pulse at low level) and holds the BLCNTRL signal at the high level for a predetermined time (FIG. 23(b)).

The page buffer 94 resets the latch upon receiving the RST signal. Besides, the nMOS 94f of the page buffer 94 transmits the data stored in the memory cell column 92a, to the node SNS2, upon receiving the high level of the BLCNTRL signal. As a result, the level of the node SNS2 corresponding to the memory cell subjected to the writing beforehand is held at the high level (FIG. 23(c)). On the other hand, the level of the node SNS2 corresponding to the memory cell subjected to the erasing beforehand is turned to the low level (FIG. 23(d)). This level is latched in the corresponding page buffer 94 as the bad block information. Thus, the operation of loading the bad block address into the page buffers 94 within the memory circuit 88 is completed.

Thereafter, the address judging circuit 96 compares the block address BADD with the bad block address in the ordinary write operation, read operation and erase operation. In a case where both the addresses have coincided, the BBLKFLG signal is turned to the high level, and the level of an FLG# terminal is turned to the low level. Besides, a logic controlling circuit 14 stops the internal operations upon receiving the BBLKFLG signal, thereby to inhibit any operation on the bad block.

Also in this embodiment, the same effects as in the foregoing first and second embodiments can be attained. Further, in this embodiment, the memory circuits 88 in the same number as the maximum allowed number of blocks are formed. Therefore, the bad block information need not be stored every block, and a chip size can be reduced.

Incidentally, the foregoing first embodiment has been explained as to the example in which the bad block information is held in the latching circuit 54 constructed of the inverter. The present invention is not restricted thereto, but the bad block information may well be held in, for example, a fuse being a non-volatile element or a non-volatile memory cell. Alternatively, the bad block information may well be held in a volatile memory cell.

Figure 24:
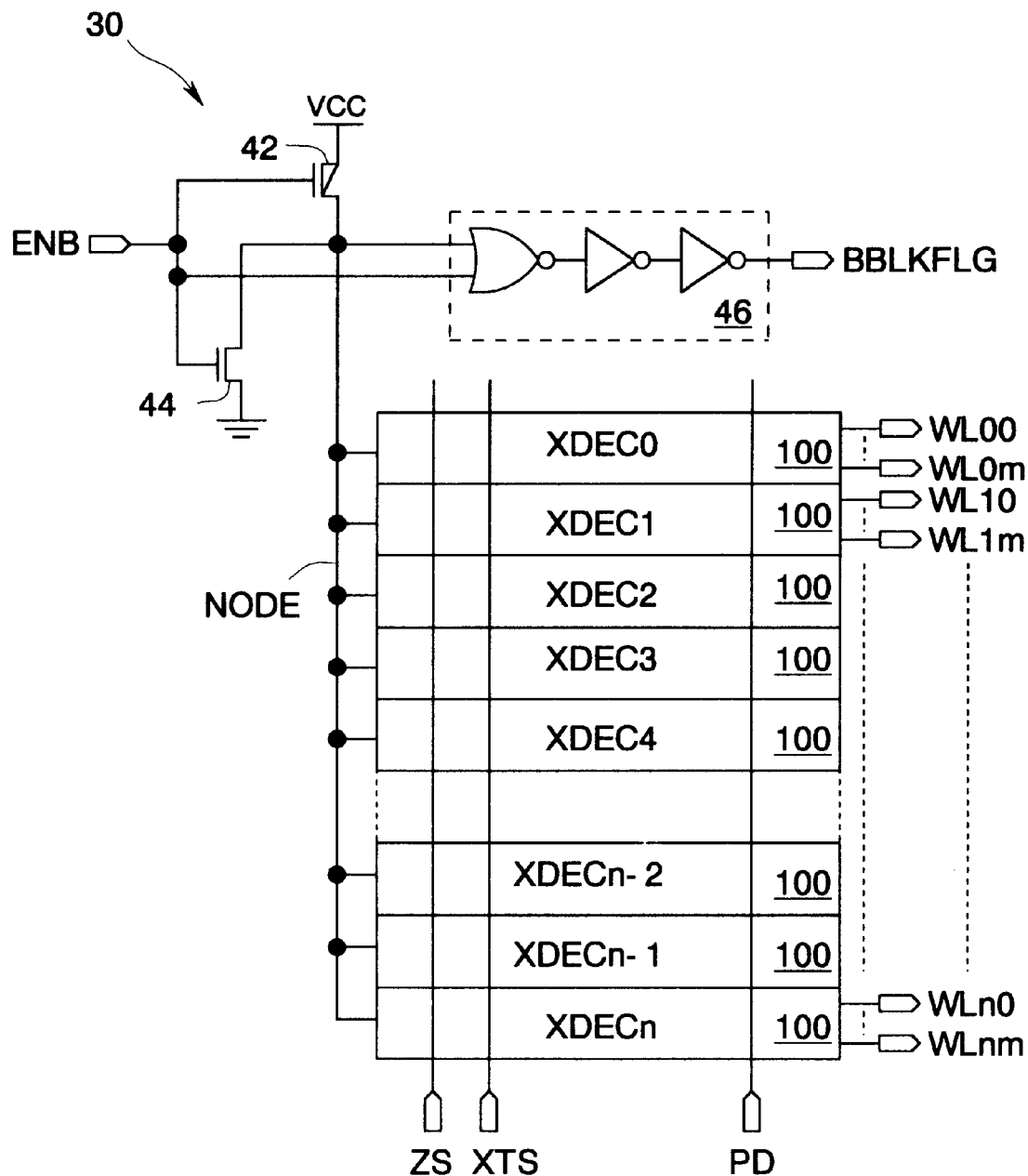
FIG. 24 is a circuit diagram showing another example of a row address decoder.
Figure 25:
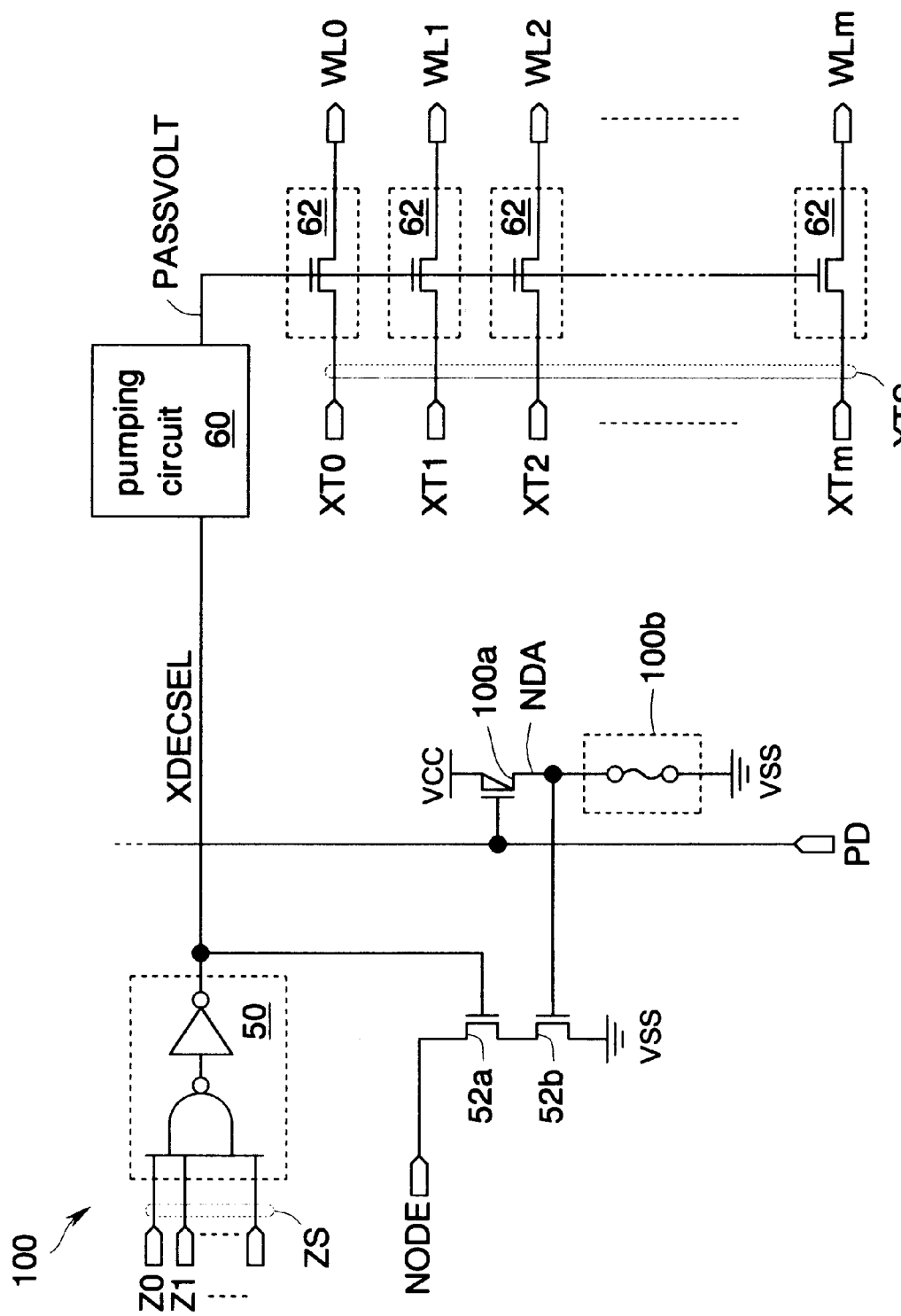
FIG. 25 is a circuit diagram showing another example of a decoding circuit.

FIGS. 24 and 25 show an example of constructing a row address decoder using fuses. In FIG. 24, decoding circuits 100 are the same as the decoding circuits 48 of the first embodiment (as shown in FIG. 4) except that a standby signal PD is fed. In FIG. 25, a node NDA is connected to a PMOS 100a and to one end of the fuse 100b made of polysilicon. The other end of the fuse 100b is connected to a ground line VSS. The pMOS 10a is controlled by the PD signal.

In this example, the fuses 100b corresponding to bad blocks are blown out in accordance with the result of a probing test on a wafer. When the fuses 100b are formed in the row address decoder in this manner, the bad block information can be stored before the shipment of the flash memory as in the second embodiment. Here, even when non-volatile memory cells are formed in the row address decoder, the same effect is attained. In the case of the non-volatile memory cell, the defect information can be rewritten with ease.

Besides, the foregoing first to third embodiments have been explained as to the example in which the bad block information is externally transmitted through the FLG# terminal. The present invention is not limited thereto, but the bad block information may well be outputted to the exterior in correspondence with a command input by way of example.

Figure 26:
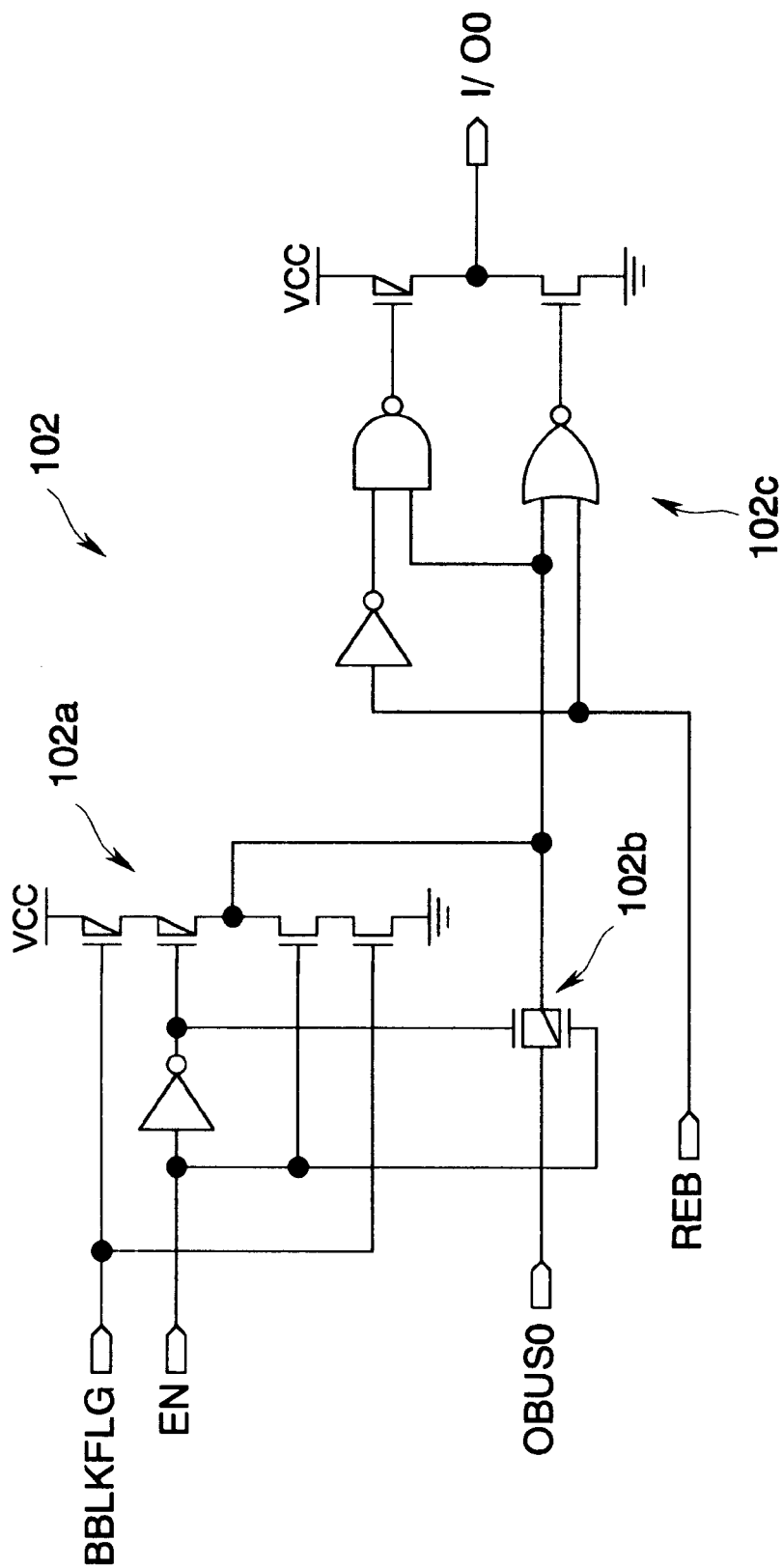
FIG. 26 is a circuit diagram showing an example of an output circuit for outputting bad block information from I/O terminals.

FIG. 26 shows an example of an output circuit for outputting bad block information from an I/O terminal.

The output circuit 102 includes a clocked inverter 102a, a CMOS transmission gate 102b and an output buffer 102c. The clocked inverter 102a outputs the inverted signal of a BBLKFLG signal to the output buffer 102c upon receiving the high level of an enable signal EN. The CMOS transmission gate 102b outputs ordinary read data upon receiving the low level of the enable signal EN. Besides, the output buffer 102c outputs the bad block information or the read data to the I/O0 terminal upon receiving the activation (the low level) of a read signal REB.

Figure 27:
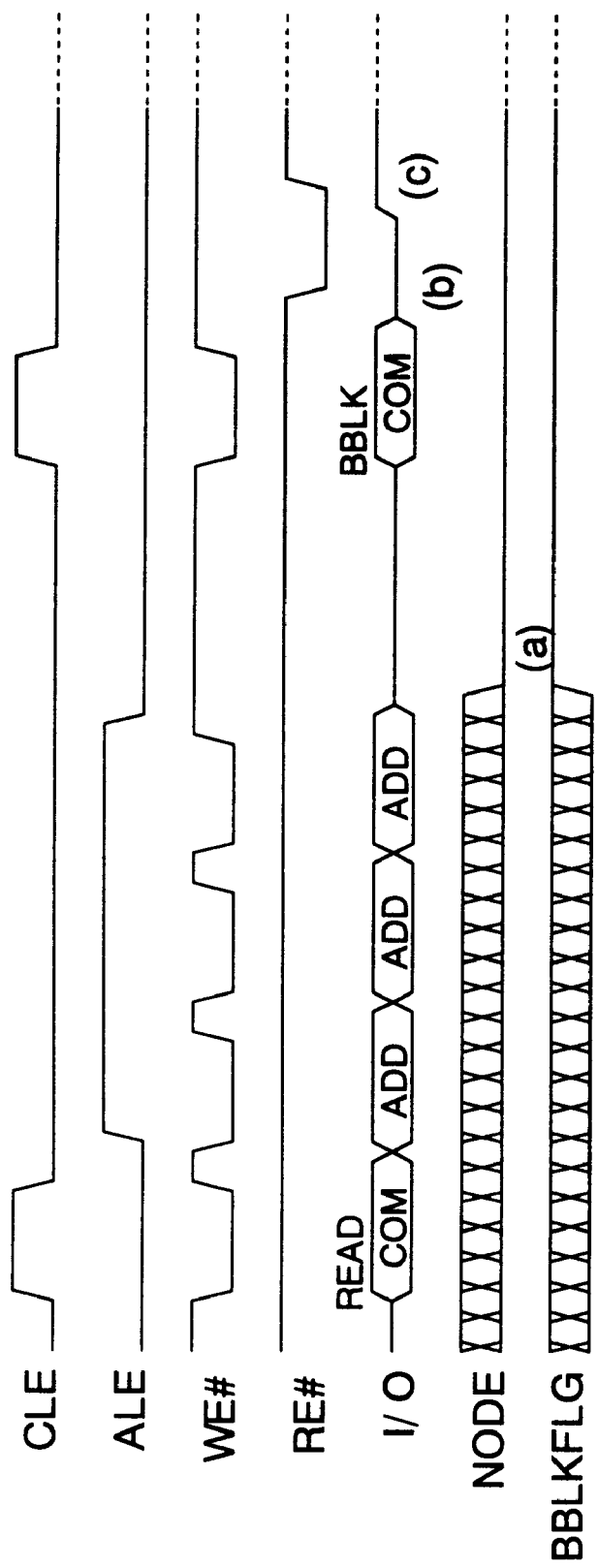
FIG. 27 is a timing chart showing the operation of outputting bad block information.

FIG. 27 shows the output timings of the bad block information in the flash memory including the output circuit 102.

First, a read command RCOM and a block address (ADD) are fed as in the foregoing. In a case where a block corresponding to the block address is bad, the node NODE shown in FIG. 4 is turned to the low level, and the BBLK-FLG signal is turned to the high level (FIG. 27(a)).

Thereafter, a bad block information output command BCOM is fed in synchronization with a CLE signal and a WE# signal (FIG. 27(b)). Then, the output buffer 102c is activated in synchronization with a read enable signal RE#, and it outputs a high level to the I/O0 terminal (FIG. 27(c)).

Figure 28:
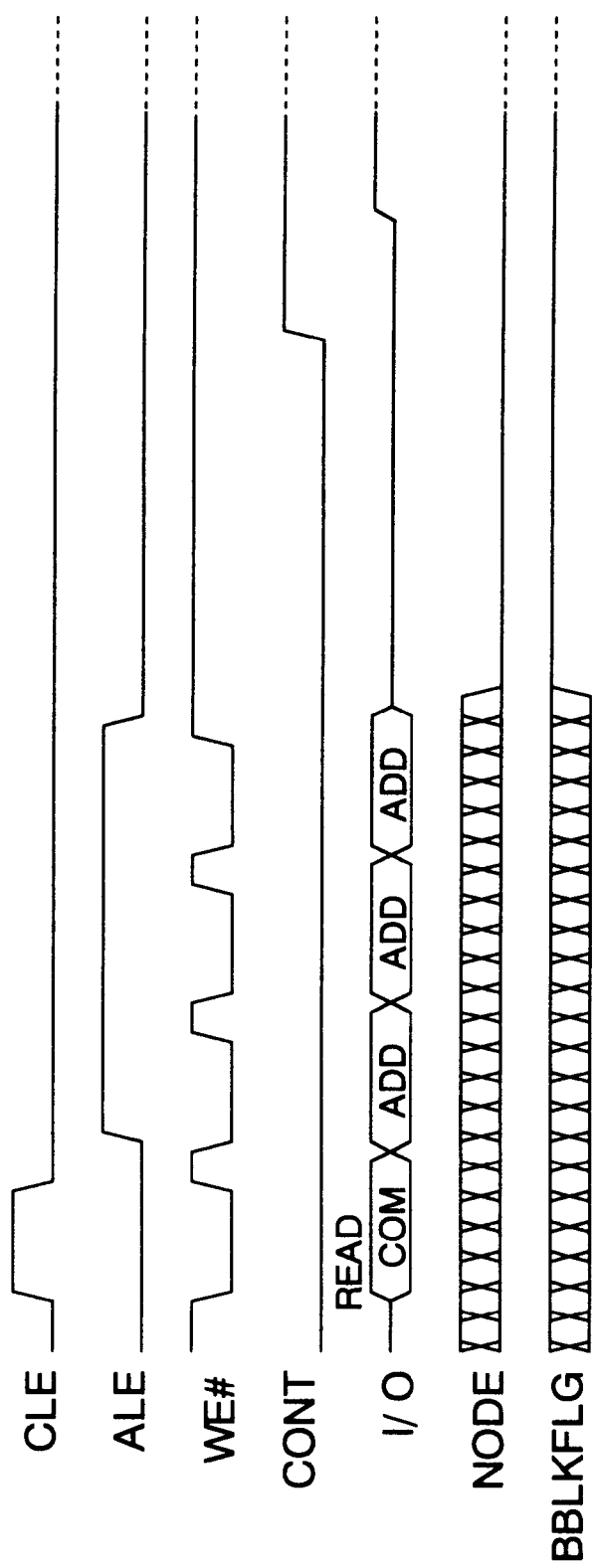
FIG. 28 is a timing chart showing another example of the operation of outputting bad block information.

FIG. 28 shows another example of the output timings of the bad block information in the flash memory including the output circuit 102. In this example, the output buffer 102c is activated when a high level has been fed to a dedicated terminal CONT, and it outputs the bad block information to the I/O0 terminal.

Further, in the foregoing third embodiment, the verification pass signal VERPASS may well be forcibly changed onto the pass side when the bad block has been accessed.

The invention is not limited to the above embodiments and various modifications may be made without departing from the spirit and the scope of the invention. Any improvement may be made in part or all of the components.

What is claimed is:

1. A non-volatile semiconductor memory device comprising:
   a plurality of memory cell units, each including a plurality of non-volatile memory cells capable of having data electrically rewritten;
   a storage unit for storing defect information of said memory cell unit not normally operating; and
   an access inhibiting circuit for inhibiting access to said memory cell unit not normally operating and for stopping an internal operation according to said defect information.

2. A non-volatile semiconductor memory device according to claim 1, wherein said storage unit is formed of non-volatile elements.

3. A non-volatile semiconductor memory device according to claim 2, wherein said storage unit is constructed of said non-volatile memory cells respectively formed in said memory cell units and stores said defect information in each of said memory cell units.

4. A non-volatile semiconductor memory device according to claim 1, wherein the number of said storage units corresponds to a number of said memory cell units not normally operating, which are allowed by the memory device.

5. A non-volatile semiconductor memory device according to claim 1, comprising an output controlling circuit for outputting said defect information to the exterior when said memory cell unit not normally operating is accessed.

6. A non-volatile semiconductor memory device according to claim 1, wherein said defect information is outputted in response to a request from the exterior when said memory cell unit not normally operating is accessed.

7. A non-volatile semiconductor memory device according to claim 6, wherein said request from the exterior is made by a command input.

8. A non-volatile semiconductor memory device, comprising:
   a plurality of memory cell units, each including a plurality of non-volatile memory cells capable of having data electrically rewritten; and
   a storage unit for storing defect information of said memory cell unit not normally operating;
   wherein when an erase operation has occurred on said memory cell unit not normally operating, the erase operation in the memory device is forcibly terminated.

9. A non-volatile semiconductor memory device according to claim 8, wherein said storage unit is constructed of said non-volatile memory cells respectively formed in said memory cell units and stores said defect information in each of said memory cell units.

10. A non-volatile semiconductor memory device according to claim 8, wherein the number of said storage units corresponds to a number of said memory cell units not normally operating, which are allowed by the memory device.

* * * * *